(12) United States Patent
Yen et al.

(10) Patent No.: US 12,002,729 B2
(45) Date of Patent: Jun. 4, 2024

(54) ELECTRONIC PACKAGE AND METHOD OF MANUFACTURING THE SAME

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/390,697

(22) Filed: Jul. 30, 2021

(65) Prior Publication Data

US 2023/0037201 A1 Feb. 2, 2023

(51) Int. Cl.
| | |
|---|---|
| H01L 23/367 | (2006.01) |
| H01L 21/56 | (2006.01) |
| H01L 23/00 | (2006.01) |
| H01L 23/31 | (2006.01) |
| H01L 23/498 | (2006.01) |
| H01L 25/065 | (2023.01) |

(52) U.S. Cl.
CPC ........ *H01L 23/3675* (2013.01); *H01L 21/565* (2013.01); *H01L 23/3128* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 25/0655* (2013.01); *H01L 25/0657* (2013.01); *H01L 2224/16145* (2013.01); *H01L 2224/16235* (2013.01); *H01L 2225/06513* (2013.01); *H01L 2225/06517* (2013.01); *H01L 2225/06568* (2013.01); *H01L 2225/06589* (2013.01)

(58) Field of Classification Search
None
See application file for complete search history.

(56) References Cited

U.S. PATENT DOCUMENTS

| | | | | |
|---|---|---|---|---|
| 7,745,262 | B2 * | 6/2010 | Huang | H01L 23/3677 |
| | | | | 257/706 |
| 9,048,209 | B2 * | 6/2015 | Oh | H01L 21/76895 |
| 9,048,211 | B2 * | 6/2015 | Pagaila | H01L 23/3114 |
| 9,443,828 | B2 * | 9/2016 | Pagaila | H01L 21/565 |
| 2010/0237477 | A1 * | 9/2010 | Pagaila | H01L 25/105 |
| | | | | 257/E23.114 |
| 2022/0077075 | A1 * | 3/2022 | Pu | H01L 24/19 |

FOREIGN PATENT DOCUMENTS

KR 10-1999-0057571 7/1999

* cited by examiner

*Primary Examiner* — Long Pham
(74) *Attorney, Agent, or Firm* — FOLEY & LARDNER LLP

(57) ABSTRACT

A electronic package and a method of manufacturing the same are provided. The electronic package includes an electronic component, a thermal spreading element, and an encapsulant. The electronic component has a first surface. The thermal spreading element is disposed over the electronic component and has a first surface facing the first surface of the electronic component. The encapsulant covers the electronic component and has a first surface closer to the first surface of the thermal spreading element than the first surface of the electronic component.

18 Claims, 25 Drawing Sheets

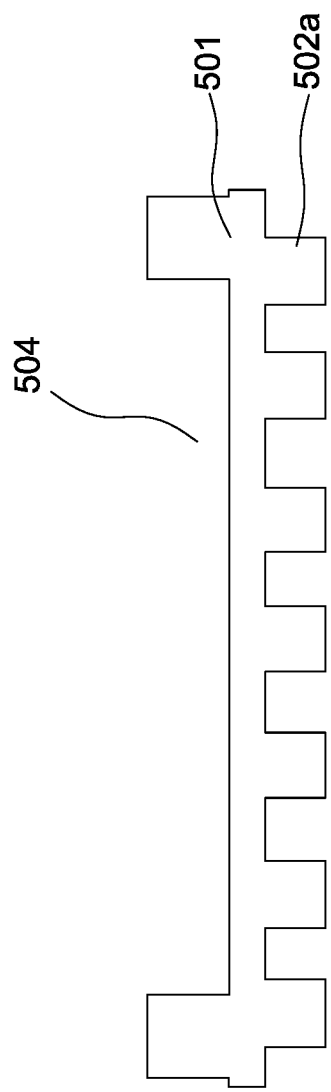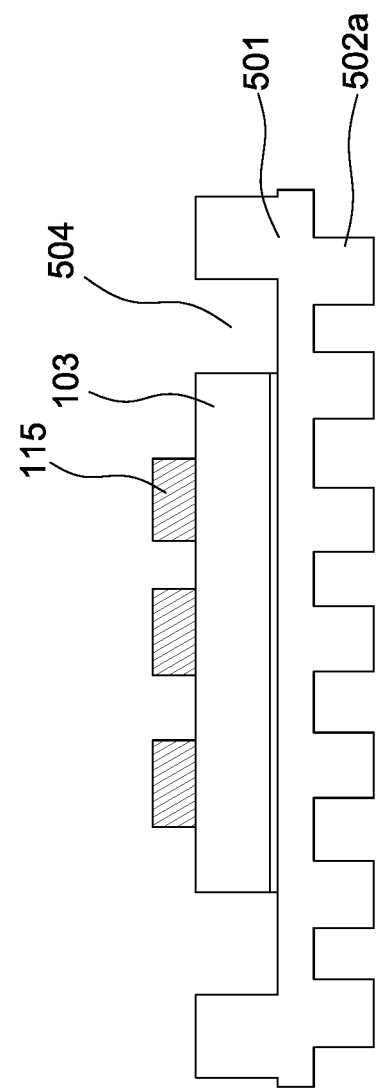
FIG. 14A
FIG. 14B

ELECTRONIC PACKAGE AND METHOD OF MANUFACTURING THE SAME

BACKGROUND

1. Technical Field

The present disclosure relates to an electronic package and a method of manufacturing the same, and more particularly, to an electronic package and a method of manufacturing the same that can improve the heat dissipation effect with a reliable structure.

2. Description of the Related Art

It has become common to incorporate multiple functions to an electronic package while reducing the size of the electronic package. However, more heat may be generated and accumulated in the electronic package, and if heat is not dissipated efficiently, it would adversely affect the performance of the semiconductor component(s) in the package. Therefore, it is desirable to provide electronic package with better heat dissipation to alleviate the problem of heat accumulation.

SUMMARY

In an aspect, an electronic package includes an electronic component, a thermal spreading element, and an encapsulant. The electronic component has a first surface. The thermal spreading element is disposed over the electronic component and has a first surface facing the first surface of the electronic component. The encapsulant covers the electronic component and has a first surface closer to the first surface of the thermal spreading element than the first surface of the electronic component.

In an aspect, an electronic package includes a thermal spreading element, an electronic component, and a first encapsulant. The electronic component is attached to the thermal spreading element and includes a plurality of electrical connectors. The first encapsulant encapsulates the electronic component, wherein a surface of the first encapsulant and an end surface of the electrical connector are substantially coplanar.

In an aspect, a method of manufacturing an electronic package includes: disposing an electronic component on a first surface of a thermal spreading element through a thermal conductive layer; and forming an encapsulant on the first surface of the thermal spreading element to encapsulate the electronic component and the thermal conductive layer.

BRIEF DESCRIPTION OF THE DRAWINGS

FIG. 14A, FIG. 14B, FIG. 14C, FIG. 14D, FIG. 14E, and FIG. 14F illustrate a method for manufacturing an electronic package according to some embodiments of the present disclosure.

DETAILED DESCRIPTION

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As the size of an electronic package and a semiconductor component continues the trend of decreasing, and it has become common to incorporate multiple semiconductor components into a single electronic package to provide more functions, more heat is generated, which may accumulate if not dissipated in an appropriate manner, and may adversely affect the performance of the semiconductor components. Therefore, how to dissipate heat generated from such components (particularly from a high-power electronic component, e.g., from a die) in a limited space effectively has become an issue. For these and other reasons, it is desirable to provide electronic packages with better heat dissipation to alleviate the problem of heat accumulation.

In an aspect, an electronic package includes an electronic component, a thermal spreading element, and an encapsulant. The electronic component has a first surface. The thermal spreading element is disposed over the electronic component and has a first surface facing the first surface of the electronic component. The encapsulant covers the electronic component and has a first surface closer to the first surface of the thermal spreading element than the first surface of the electronic component.

Figure 1:
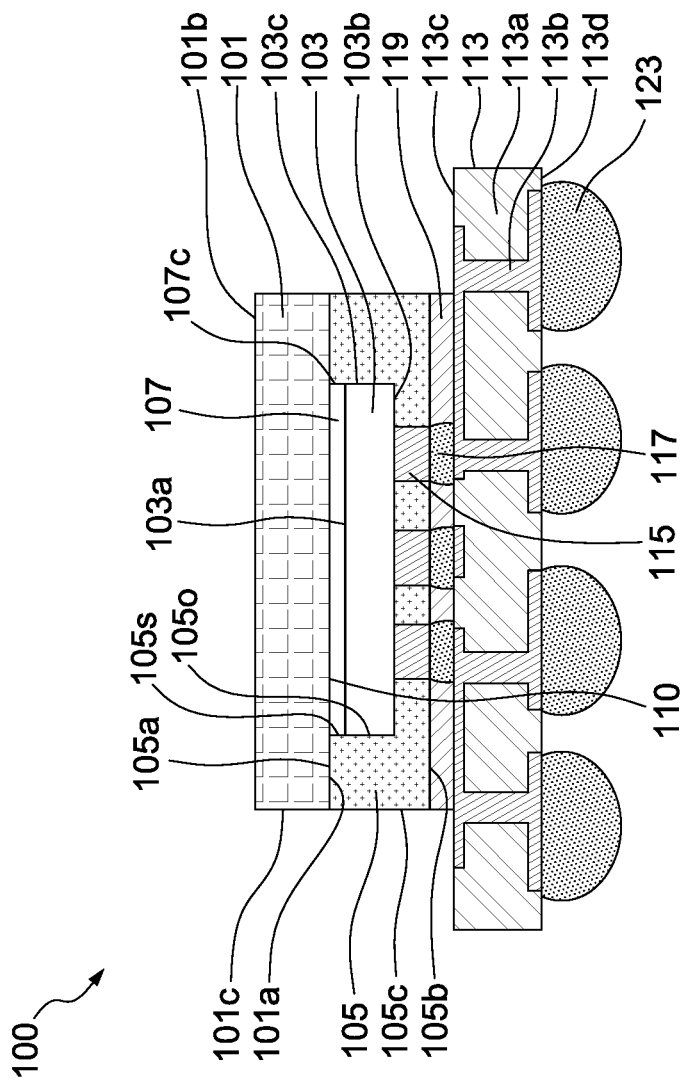
FIG. 1 illustrates a cross-sectional view of a semiconductor device according to some embodiments of the present disclosure.

FIG. 1 illustrates a cross-sectional view of an electronic package 100 according to some embodiments of the present disclosure. The electronic package 100 of FIG. 1 includes a thermal spreading element 101, an electronic component 103, and an encapsulant 105.

The thermal spreading element 101 has a first surface 101a and a second surface 101b opposite to the first surface 101a. The thermal spreading element 101 may be, for example, a heat sink or a metal plate. The thermal spreading element 101 may include a thermal conductive material including, for example, copper, steel, stainless steel, or solder. In some embodiments, the thermal spreading element 101 is a stainless steel heat sink. In some embodiments, the thermal spreading element 101 is a copper heat sink. The thermal spreading element 101 is disposed over the electronic component 103.

The electronic component 103 has a first surface 103a facing the first surface 101a of the thermal spreading element 101 and a second surface 103b opposite to the first surface 103a. A projection area of the electronic component 103 (e.g., a projection area of the first surface 103a of the electronic component 103) on the first surface 101a of the thermal spreading element 101 is smaller than a surface area of the first surface 101a of the thermal spreading element. The first surface 103a may be an inactive surface of the electronic component 103. The electronic component 103 may include an active component (e.g., a die or a chip). In some embodiments, the electronic component 103 includes a die. The electronic component 103 may be thermally coupled to the first surface 101a of the thermal spreading element 101 through a thermal conductive layer 107.

The encapsulant 105 covers the electronic component 103. The encapsulant 105 may be disposed adjacent to the first surface 101a of the thermal spreading element 101. The encapsulant 105 may be disposed on (e.g., physical contact) the first surface 101a of the thermal spreading element 101. The encapsulant 105 has a first surface 105a and a second surface 105b opposite to the first surface 105a. The first surface 105a of the encapsulant 105 may be closer to the first surface 101a of the thermal spreading element 101 than the first surface 103a of the electronic component 103. The first surface 105a of the encapsulant 105 may contact the first surface 101a of the thermal spreading element 101. The encapsulant 105 has a side surface 105c connecting the first surface 105a to the second surface 105b. The side surface 105c of the encapsulant 105 may be substantially coplanar with a side surface 101c of the thermal spreading element 101 that connects the first surface 101a to the second surface 101b of the thermal spreading element 101. By contacting the encapsulant 105 to the thermal spreading element 101 directly, heat in the encapsulant 105 generated from the electronic component 103 may be dissipated more efficiently by passing through the thermal spreading element 101, which may improve the heat dissipation efficiency.

The encapsulant 105 and the thermal spreading element 101 may define a first space 105o for accommodating the electronic component 103. The encapsulant 105 may cover the electronic component 103 and define a second space 105s between the first surface 103a of the electronic component 103 and the thermal spreading element 101. In some embodiments, the encapsulant 105 surrounds the electronic component 103 with the first surface 105a of the encapsulant 105 exposing the first surface 103a of the electronic component 103 and contacting the first surface 101a of the thermal spreading element 101. The first surface 105a of the encapsulant 105 may be at an elevation higher than the first surface 103a of the electronic component 103. The first surface 105a of the encapsulant 105 may protrude from the first surface 103a of the electronic component 103 and define the second space 105s between the first surface 103a of the electronic component 103 and the thermal spreading element 101. The second space 105s may be disposed with a thermal conductive layer 107 so that the electronic component 103 may be thermally coupled to the thermal spreading element 101 through the thermal conductive layer 107. A protrusion of the encapsulant 105 above the first surface 103a of the electronic component 103 may surround a thermal conductive layer 107 disposed in the second space 105s between the first surface 103a of the electronic component 103 and the thermal spreading element 101. In some embodiments, the encapsulant 105 embeds the electronic component 103 with only the first surface 103a of the electronic component 103 exposed from the first surface 105a of the encapsulant 105. The encapsulant 105 may include an epoxy resin having fillers, a molding compound (e.g., an epoxy molding compound or other molding compound), polyimide, a phenolic compound or material, a material with a silicone dispersed therein, or a combination thereof.

In some embodiments, the electronic package 100 may further include a thermal conductive layer 107. The thermal conductive layer 107 is thermally coupled to the first surface 101a of the thermal spreading element 101 and the first surface 103a of the electronic component 103. The thermal conductive layer 107 may be disposed between the thermal spreading element 101 and the electronic component 103 (i.e., between the first surface 101a of the thermal spreading element 101 and the first surface 103a of the electronic component 103). The thermal conductive layer 107 may contact the thermal spreading element 101 and the electronic component 103. The thermal conductive layer 107 may be disposed in the first space 105o defined by the encapsulant 105 and the electronic component 103. A surface 110 of the thermal conductive layer 107 may be substantially coplanar with the first surface 105a of the encapsulant 105. The thermal conductive layer 107 may be surrounded by the encapsulant 105. The protrusion of the encapsulant 105 may be in contact with the thermal conductive layer 107. In some embodiments, a projection area of the thermal conductive layer 107 (e.g., a projection area of the surface 110 of the thermal conductive layer 107) on the first surface 101a of the thermal spreading element 101 may be no greater than (i.e., substantially the same as or smaller than) that of the first surface 103a of the electronic component 103 on the first surface 101a of the thermal spreading element 101. In some embodiments, a projection area of a surface of the thermal conductive layer 107 on the first surface 101a of the thermal spreading element 101 is smaller than a surface area of the first surface of the thermal spreading element 101. A surface area of the surface 110 of the thermal conductive layer 107 may be smaller than that of the first surface 101a of the thermal spreading element 101. A side surface 107c of the thermal conductive layer 107 may be substantially coplanar with a side surface 103c of the electronic component 103 connecting the first surface 103a to the second surface 103b of the electronic component 103.

The thermal conductive layer 107 may include a thermal conductive material, for example, a metal (e.g., copper or other metal or alloy), a metal oxide, a carbon material (e.g., carbon nanotube or graphene) and other suitable material. In some embodiment, the thermal conductive material may be thermal conductive particles. In some embodiments, the thermal conductive layer 107 may further include an adhesive material, for example, a polymer (e.g., silicon-based resin, epoxy-based resin, acrylic-based rein or other polymeric material). In some embodiments, the thermal conductive layer 107 may include a thermal conductive paste including, for example, a copper paste or a solder paste. The thermal conductive layer 107 may include a thermal conductive adhesive or a thermal interface material (TIM).

In some embodiments, the thermal conductive layer 107 includes a thermal conductive adhesive. A thermal conductive adhesive may be advantageous as it may provide better adhesion to the electronic component than the TIM (e.g., those containing silver and/or indium). In the some embodiments, the TIM may contain silver and/or indium. Such TIM has poor adhesion to the material (e.g., silicon) of the electronic component due to the presence of silver and/or indium, and therefore, the temperature change in the electronic component may cause delamination between the TIM and the electronic component, thereby affecting thermal conduction path and deteriorating heat dissipation efficiency. In addition, since a thermal conductive adhesive may be applied in strip form, it may improve the units per hour (UPH) of the electronic package by simultaneously connecting multiple electronic components to a strip of the thermal spreading element 201 through a strip of adhesive. Thus, a thermal conductive adhesive 107 may provide advantages, such as connecting the electronic component 103 to the thermal spreading element 101 in a manner that is more efficient and cost-effective, while improving the heat dissipation efficiency therebetween. In some embodiments, the thermal conductive layer 107 is free of silver or indium. In some embodiments, the thermal conductive layer 107 is a thermal conductive tape.

In some embodiments, at least one electrical connector 115 may be further disposed on or adjacent to the second surface 103b of the electronic component 103 and electrically connected to the second surface 103b of the electronic component 103. The electrical connector 115 may be surrounded by the encapsulant 105 with a surface exposed from the second surface 105b of the encapsulant 105. The electrical connector 115 may be a pillar or a solder/stud bump.

In some embodiments, at least one first electrical contact 117 may be further disposed adjacent to the second surface 105b of the encapsulant 105. The first electrical contact 117 may contact the electrical connector 115. The first electrical contact 117 may be electrically connected to the electrical connector 115 for providing external electrical connection for the electronic component 103. The first electrical contact 117 may be surrounded by a dielectric layer 119. The first electrical contact 117 may be, for example, a solderable element (e.g., a solder ball). The dielectric layer 119 may be, for example, a solder mask (the material of which is, for example, polyimide (PI)), a passivation layer (the material of which is, for example, a metal oxide), or an underfill.

In some embodiments, the electronic package 100 may further include a substrate 113. The substrate 113 has a first surface 113c and a second surface 113d opposite to the first surface 113c. The substrate 113 may electrically connect to the electronic component 103 through the first surface 113c. The substrate 113 may be disposed adjacent to the electronic component 103. In some embodiments, the substrate 113 electrically connects to the electronic component 103 through the electrical connector 115 and the first electrical contact 117. The substrate 113 may include at least one conductive structure 113b disposed in or within at least one dielectric layer 113a and transmitting an electrical signal from the first surface 113c of the substrate 113 to the second surface 113d of the substrate 113. The substrate 113 may be a carrier, a printed circuit board, an interposer, or a redistribution layer.

In some embodiments, at least one second electrical contact 123 may be further disposed adjacent to the second surface 113d of the substrate 113. The second electrical contact 123 may be contact with and electrically connect to the conductive structure 113b of the substrate 113. The second electrical contact 123 may be, for example, a solderable element (e.g., a solder ball).

Figure 2:
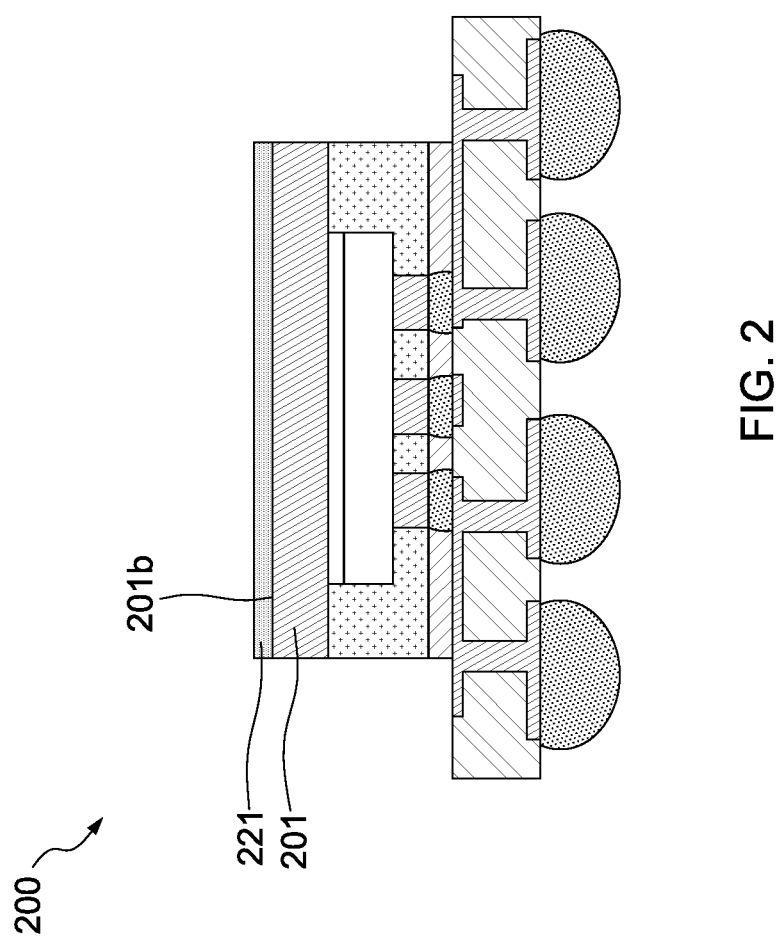
FIG. 2 illustrates a cross-sectional view of an electronic package according to some embodiments of the present disclosure.

FIG. 2 illustrates a cross-sectional view of an electronic package 200 according to some embodiments of the present disclosure. The electronic package 200 illustrated in FIG. 2 is similar to that illustrated in FIG. 1 with a difference being that a protection layer 221 may be further disposed adjacent to the second surface 201b of the thermal spreading element 201. In some embodiments, the protection layer 221 is disposed on (e.g., directly contacting) the second surface 201b of the thermal spreading element 201. The protection layer 221 may prevent the thermal spreading element 201 from oxidation. The protection layer 221 may include, for example, an oxide layer or a metal oxide layer.

Figure 3:
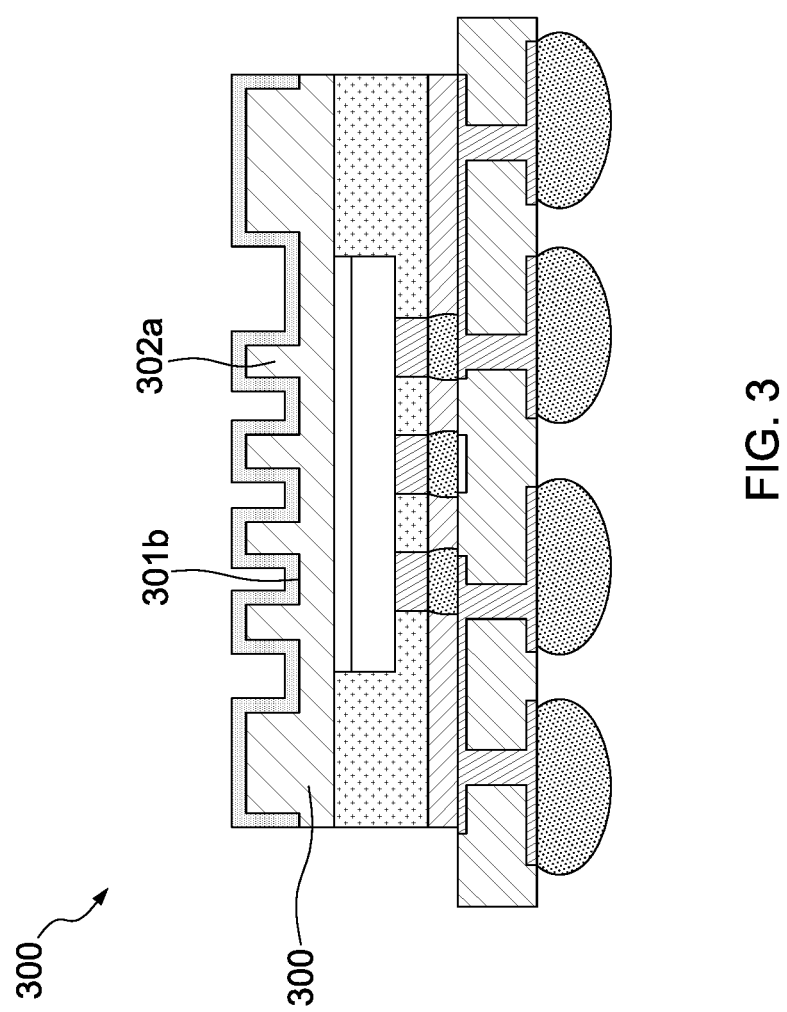
FIG. 3 illustrates a cross-sectional view of an electronic package according to some embodiments of the present disclosure.

FIG. 3 illustrates a cross-sectional view of an electronic package 300 according to some embodiments of the present disclosure. The electronic package 300 illustrated in FIG. 3 is similar to that illustrated in FIG. 2 with a difference being that the thermal spreading element 300 may include at least one first protrusion portion 302a at the second surface 301b of the thermal spreading element 301. The first protrusion portion 302a may be a fin-like structure. By disposing at least one first protrusion portion 302a at the second surface 301b of the thermal spreading element 301, the heat dissipation effect of the thermal spreading element 301 may be further improved because of the increase of the surface area exposed to air.

Figure 4:
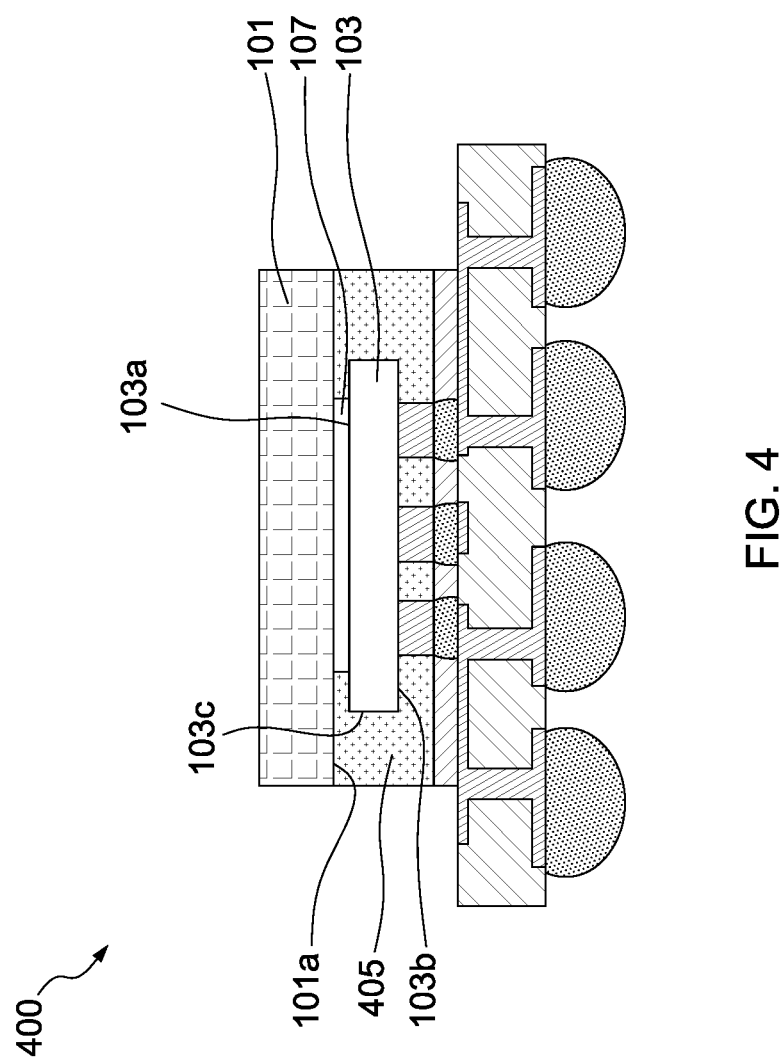
FIG. 4 illustrates a cross-sectional view of an electronic package according to some embodiments of the present disclosure.

FIG. 4 illustrates a cross-sectional view of an electronic package 400 according to some embodiments of the present disclosure. The electronic package 400 illustrated in FIG. 4 is similar to that illustrated in FIG. 1 with a difference being that a portion of the encapsulant 405 may be disposed between the first surface 103a of the electronic component 103 and the first surface 101a of the thermal spreading element 101, which may provide a mold lock effect and help to alleviate the delamination issue. The encapsulant 405 may extend from the second surface 103b of the electronic component 103 to the first surface 103a via the side surface 103c connecting the first surface 103a to the second surface 103b. The encapsulant 405 may cover a portion of the first surface 103a of the electronic component 103 and be in contact with the thermal conductive layer 107 (e.g., the side surface of the thermal conductive layer).

Figure 5A:
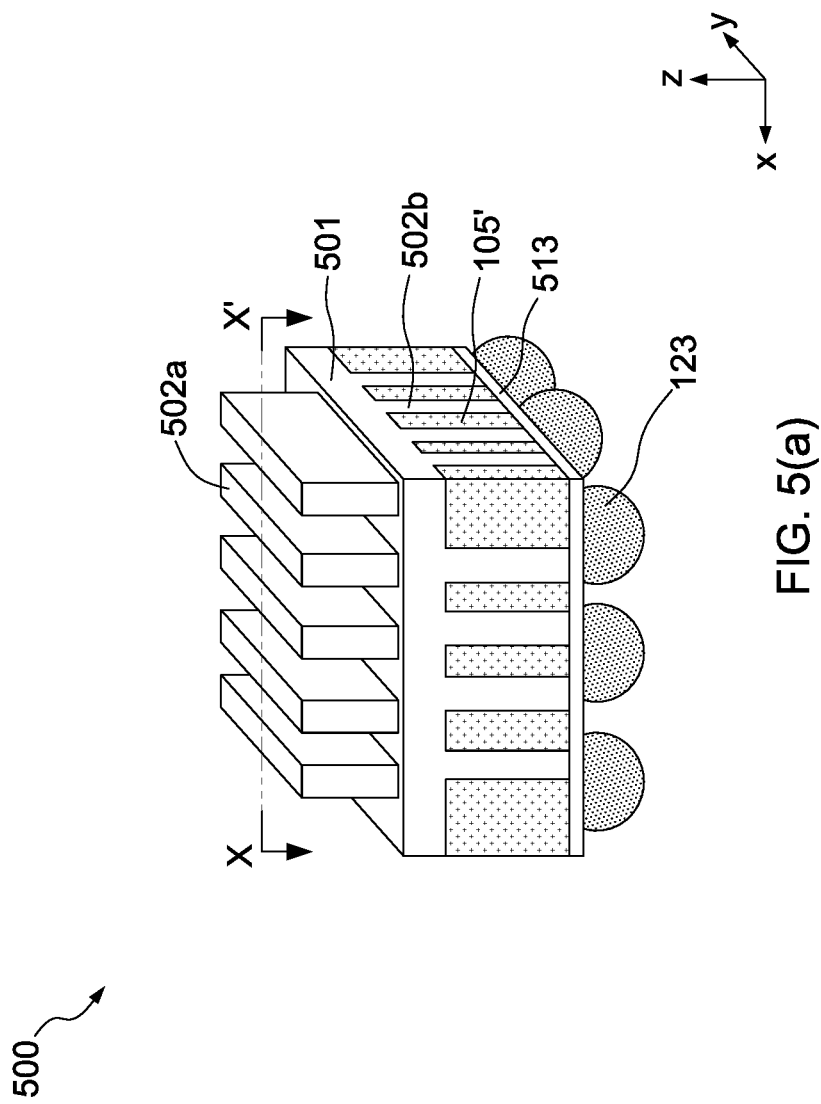
FIG. 5(a) illustrates a three-dimensional view of an electronic package according to some embodiments of the present disclosure.
Figure 5B:
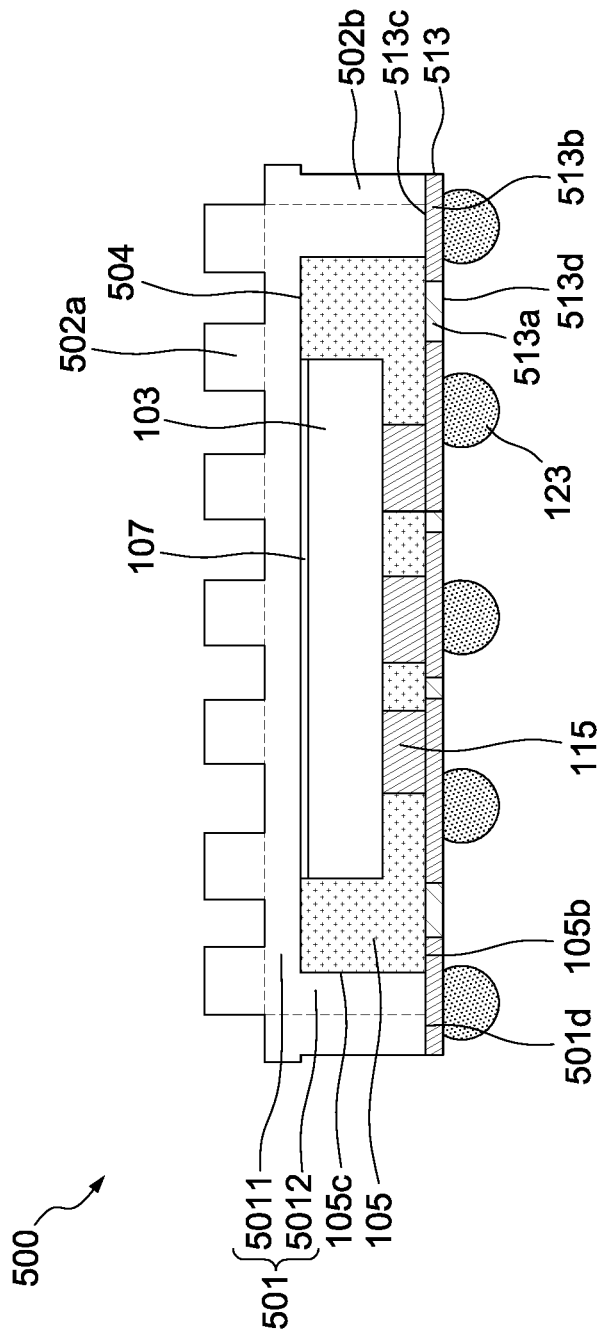
FIG. 5(b) illustrates a cross-sectional view of the electronic package along the X-X' line indicated in FIG. 5(a).

FIG. 5(a) illustrates a three-dimensional view of an electronic package 500 according to some embodiments of the present disclosure. FIG. 5(b) illustrates a cross-sectional view of the electronic package 500 taken along the X-X' line indicated in FIG. 5(a). The electronic package 500 includes a thermal spreading element 501, an electronic component 103, and an encapsulant. The encapsulant may include a first encapsulant 105 disposed within a space defined by the thermal spreading element 501 and a second encapsulant 105' disposed outside the space.

Referring to FIG. 5(b), the thermal spreading element 501 has a base (which can be also referred to as "base portion") 5011 covering the first surface 105a of the first encapsulant 105 and a sidewall (which can be also referred to as "sidewall portion") 5012 connecting to the base 5011 and covering the side surface 105c of the first encapsulant 105. The base 5011 of the thermal spreading element 501 includes at least one first protrusion portion 502a extending outwardly from the base 5011. The sidewall 5012 of the thermal spreading element 501 comprises at least one second protrusion portion 502b extending outwardly from the sidewall 5012. In some embodiments, the thermal spreading element 501 may cover at least two side surfaces 105c of the first encapsulant 105. In some embodiments, the thermal spreading element 501 may cover four side surfaces 105c of the first encapsulant 105. For better understanding the structure of the thermal spreading element 501, dashed lines are added to FIG. 5(b) to distinguish the base 5011, the sidewall 5012, the first protrusion portion 502a, and the second protrusion portion 502b; however, it should be noted that the base 5011, the sidewall 5012, the first protrusion portion 502a, and the second protrusion portion 502b may be integrally formed or monolithic.

The thermal spreading element 501 may define a space (or opening) 504 for accommodating at least one electronic component 103. Specifically, the thermal spreading element 501 has a space 504 defined by the base 5011 and the sidewall 5012 and the electronic component 103 is disposed in the space 504 of the thermal spreading element 501. The electronic component 103 may be attached to the base 5011 of the thermal spreading element 501 through the thermal conductive layer 107. The details of the thermal conductive layer 107 are described hereinabove with reference to FIGS. 1 to 4. The first encapsulant 105 may be disposed in the space 504 and encapsulate the electronic component 103. The first encapsulant 105 may be disclosed between the sidewalls 5012 of the thermal spreading element 501.

The first encapsulant 105 may have a second surface 105b opposite to the first surface 105a. The second surface 105b of the first encapsulant 105 is substantially coplanar with the surface 501d (e.g., an end surface) of the sidewall 5012 of the thermal spreading element 501. The surface 501d of the sidewall 5012 of the thermal spreading element 501 faces away from the base 5011 of the thermal spreading element 501. The second protrusion portion 502b of the thermal spreading element 501 may surround the first encapsulant 105. The sidewall 5012 of the thermal spreading element 501 may cover the side surface 105c of the first encapsulant 105. The sidewall 5012 of the thermal spreading element 501 may cover at least two side surfaces 105c of the first encapsulant 105. In some embodiments, the sidewall 5012 of the thermal spreading element 501 covers four side surfaces 105c of the first encapsulant 105. A surface of the first encapsulant 105 and an end surface of the electrical connector 115 may be substantially coplanar.

In some embodiments, the electronic package 500 may further include a substrate 513. The substrate 513 may be a redistribution layer. The redistribution layer 513 may include at least one conductive structure 513b and at least one dielectric layer 513a. The redistribution layer 513 has a first surface 513c and a second surface 513d opposite to the first surface 513c. The first surface 513c of the redistribution layer 513 may contact the surface 501d of the sidewall 5012 of the thermal spreading element 501 and the second surface 105b of the first encapsulant 105. The redistribution layer 513 may be electrically connected to the electronic component 103 via an electrical connector 115. In addition, the redistribution layer 513 may be electrically connected to the electric contact 123 disposed on the second surface 513d of the redistribution layer 513.

Referring to FIG. 5(a), the second encapsulant 105' may be disposed outside the space 104. The second protrusion portion 502b inserts into the second encapsulant 105'. The second encapsulant 105' may contact the second protrusion portion 502b and the outer surface of the sidewall 5012. The second protrusion portion 502b may be disposed at the first surface 501a of the thermal spreading element 501 along a direction pointing out of the paper (i.e., the y-direction) or a direction parallel to the first surface 501a of the thermal spreading element 501 (i.e., the x-direction). The second protrusion portion 502b may be a fin-like structure, like the first protrusion portion 502a. An outmost side surface of the second protrusion portion 502b may be substantially coplanar with an outmost side surface of the second encapsulant 105'. In some embodiments where at least two second protrusion portions 502b are included, they may be separated by a portion of the encapsulant 105'.

Figure 6A:
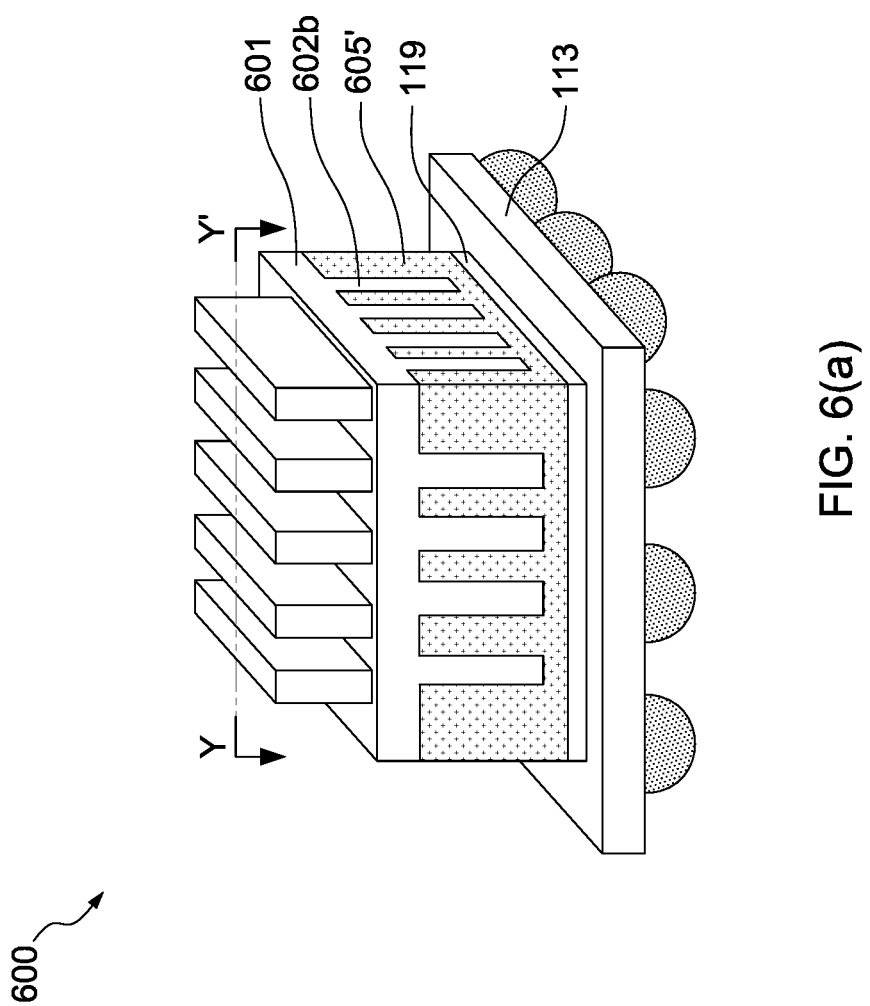
FIG. 6(a) illustrates a three-dimensional view of an electronic package according to some embodiments of the present disclosure.
Figure 6B:
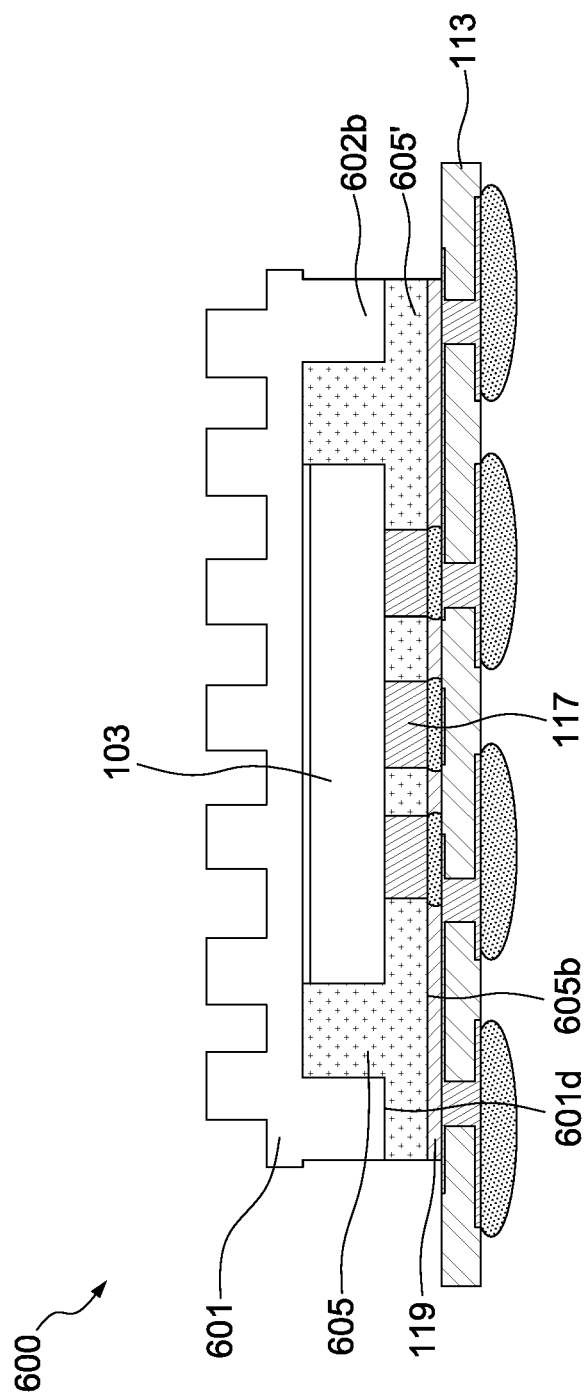
FIG. 6(b) illustrates a cross-sectional view of the electronic package along the Y-Y' line indicated in FIG. 6(a).

FIG. 6(a) illustrates a three-dimensional view of an electronic package 600 according to some embodiments of the present disclosure. FIG. 6(b) illustrates a cross-sectional view of the electronic package 600 along the Y-Y' line indicated in FIG. 6(a). The electronic package 600 illustrated in FIGS. 6(a) and 6(b) is similar to that illustrated in FIGS. 5(a) and 5(b) with a difference being that the surface 601d of the sidewall of the thermal spreading element 601 is not coplanar with the second surface 605b of the first encapsulant 605, and the redistribution layer is a substrate 113. The surface 601d of the sidewall of the thermal spreading element 601 may be spaced from the substrate 113 by a portion of the encapsulant 605. Similar to the embodiments illustrated in FIGS. 5(a) and 5(b), an outmost side surface of the second protrusion portion 602b may be substantially coplanar with an outmost side surface of the second encapsulant 605'. The second encapsulant 605' may be disposed outside the space defined by the thermal spreading element 601 for accommodating at least one electronic component 103. The second encapsulant 605' may contact the second protrusion portion 602b and the outer surface of the sidewall of the thermal spreading element 601. In some embodiments where at least two second protrusion portions 602b are included, they may be separated by a portion of the encapsulant 605'.

Figure 7:
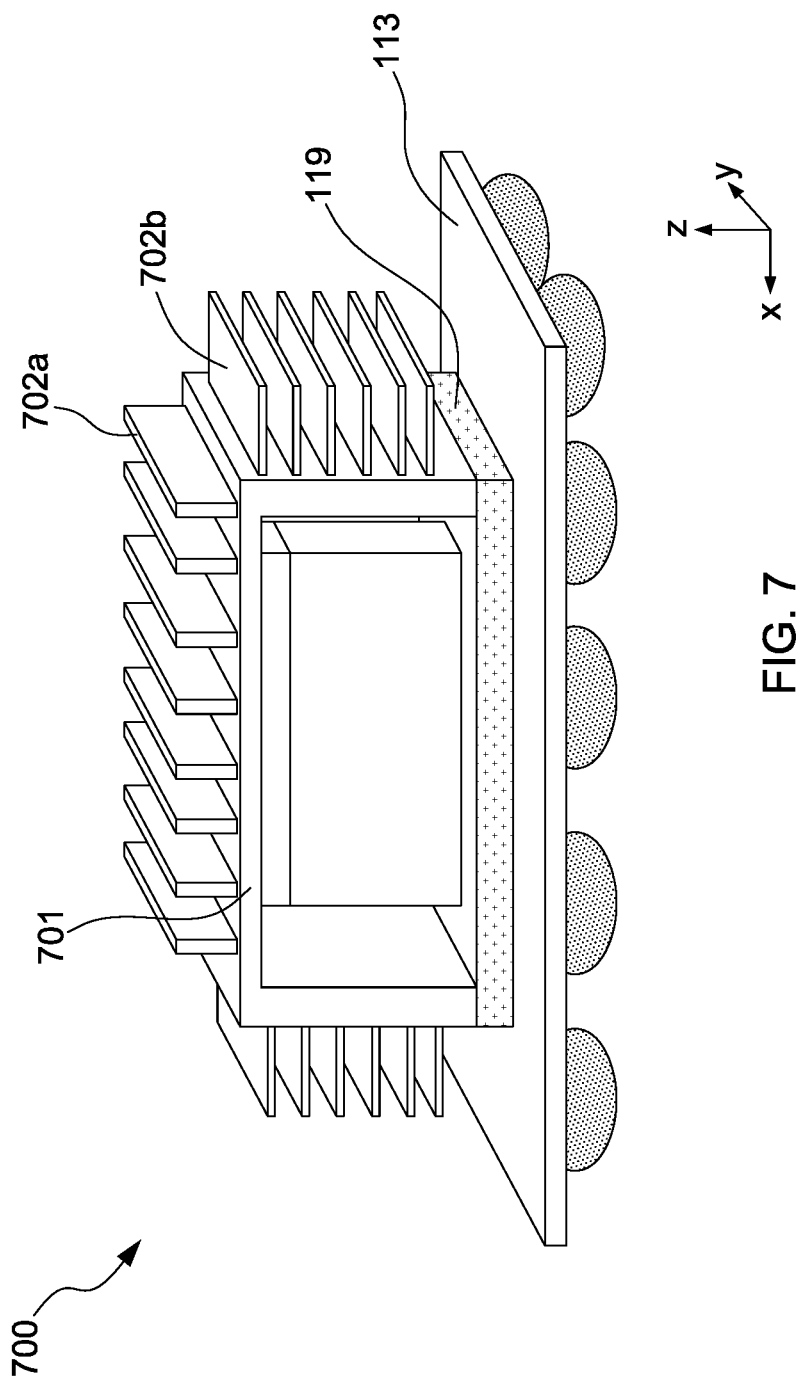
FIG. 7 illustrates a three-dimensional view of an electronic package according to some embodiments of the present disclosure.

FIG. 7 illustrates a three-dimensional view of an electronic package 700 according to some embodiments of the present disclosure, wherein a first encapsulant disposed with the space defined by the thermal spreading element 701 and a second encapsulant disposed outside the space and in contact with the second protrusion portion 702b are not drawn so that the structure of the first and second protrusion portions 702a and 702b of the thermal spreading element 701 can be clearly shown. The electronic package 700 illustrated in FIG. 7 is similar to that illustrated in FIG. 6(a) with a difference being that the second protrusion portion 702b of the thermal spreading element 701 is disposed at a sidewall of the thermal spreading element 701 along a direction different from that of the second protrusion portion 602b illustrated in FIG. 6(a). In some embodiments, the second protrusion portion 702b is disposed in parallel to the substrate 113 while the second protrusion portion 602b illustrated in FIG. 6(a) is disposed perpendicular to the substrate (i.e., the z-direction).

Figure 8:
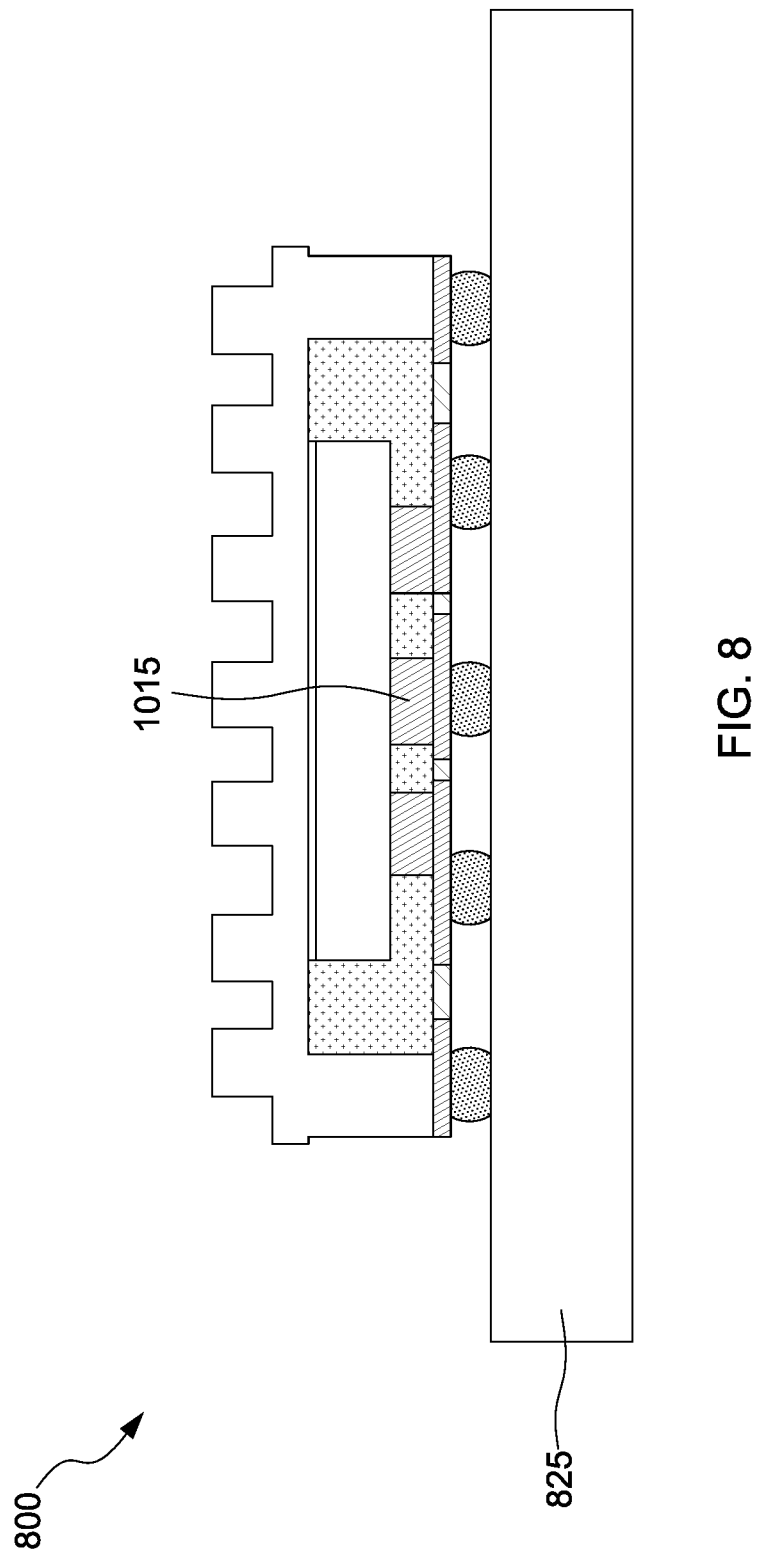
FIG. 8 illustrates a cross-sectional view of an electronic package according to some embodiments of the present disclosure.

FIG. 8 illustrates a cross-sectional view of an electronic package 800 according to some embodiments of the present disclosure. The electronic package 800 illustrated in FIG. 8 is similar to that illustrated in FIG. 5(b) with a difference being that the electronic package 800 illustrated in FIG. 8 is further electrically connected to a substrate 825. The substrate 825 may be a printed circuit board.

Figure 9:
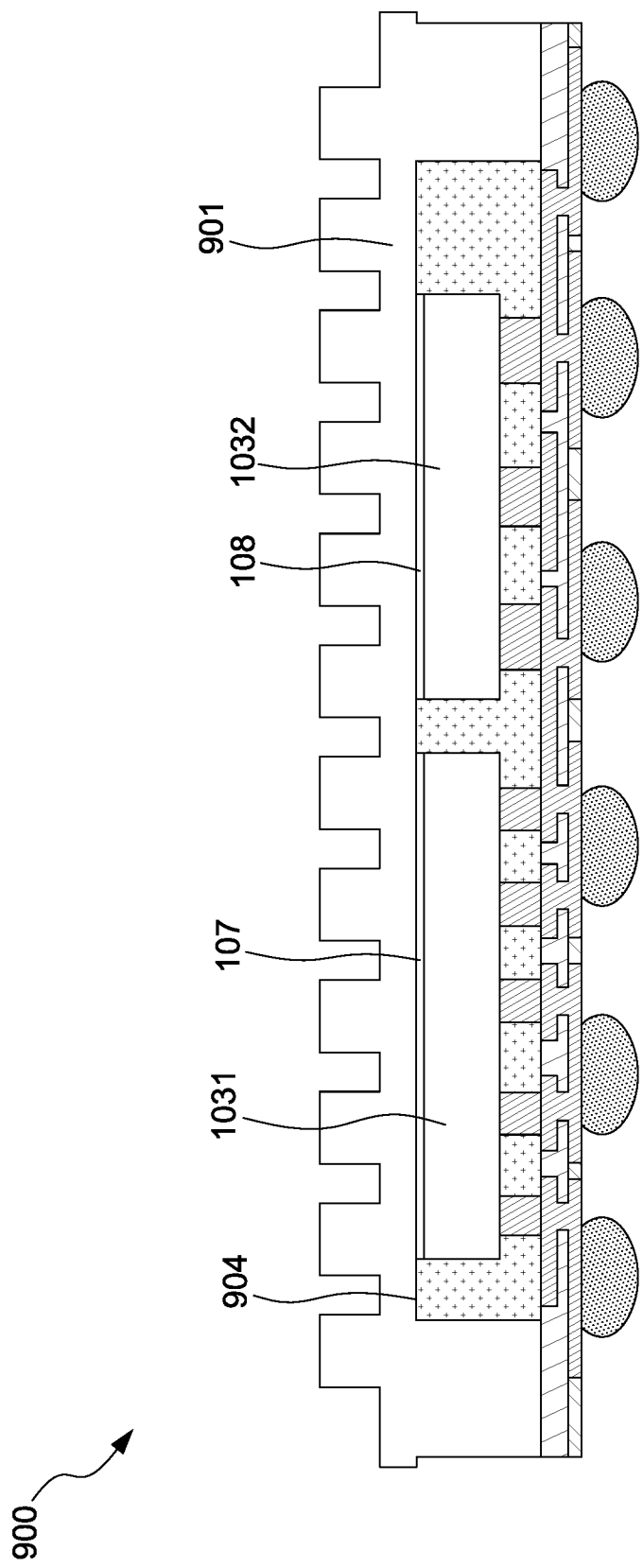
FIG. 9 illustrates a cross-sectional view of an electronic package according to some embodiments of the present disclosure.

FIG. 9 illustrates a cross-sectional view of an electronic package 900 according to some embodiments of the present disclosure. The electronic package 900 illustrated in FIG. 9 is similar to that illustrated in FIG. 5(b) with a difference being that the thermal spreading element 901 may define a space 904 accommodating a plurality of electronic components (e.g., the first electronic component 1031 and the second electronic component 1032), where each of them may be thermally coupled to the thermal spreading element 901 through a thermal conductive layer (e.g., 107 and 108), respectively. The first electronic component 1031 and the second electronic component 1032 may have different thicknesses. The first electronic component 1031 and the second electronic component 1032 may be disposed side by side.

Figure 10:
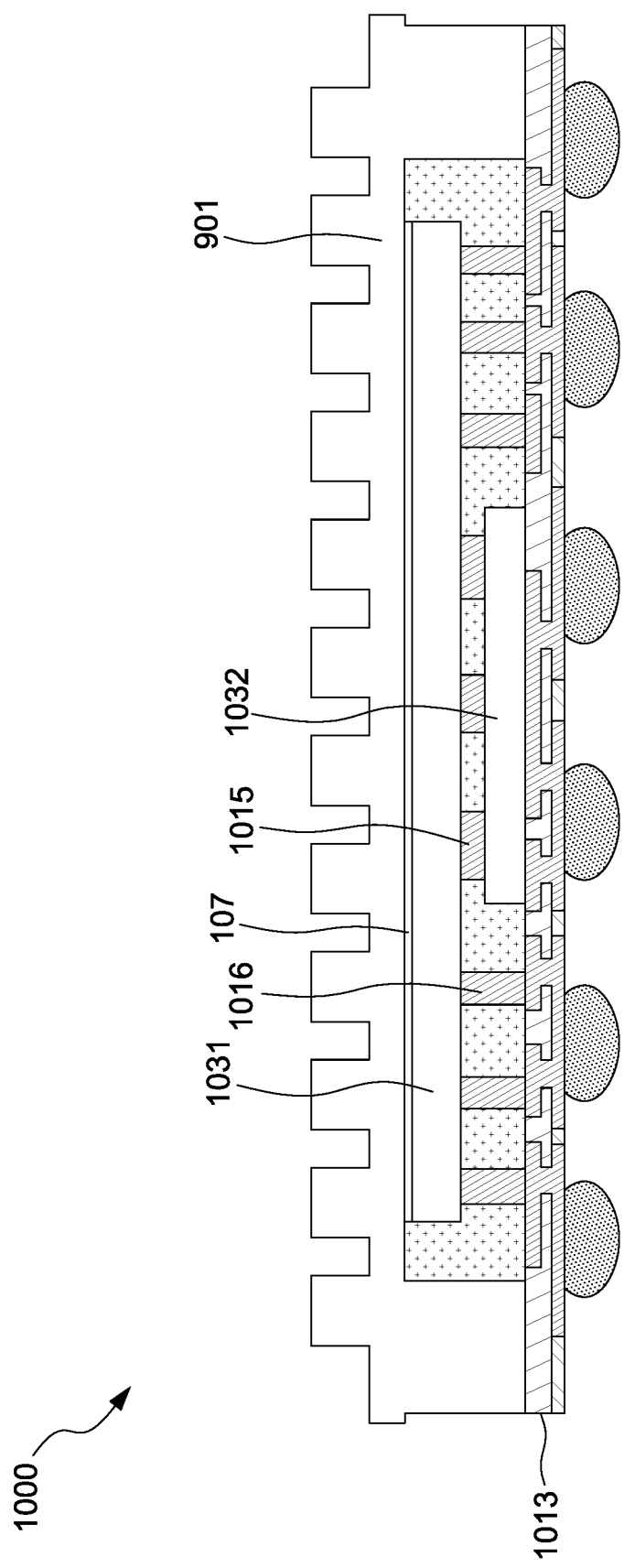
FIG. 10 illustrates a cross-sectional view of an electronic package according to some embodiments of the present disclosure.

FIG. 10 illustrates a cross-sectional view of an electronic package 1000 according to some embodiments of the present disclosure. The electronic package 1000 illustrated in FIG. 10 is similar to that illustrated in FIG. 9 with a difference being that the first electronic component 1031 may be disposed over the second electronic component 1032. The first electronic component 1031 may electrically connect to the distribution layer 1013 through the electrical connector 1016 and electrically connect to the second electronic component 1032 through the electrical connector 1015. In some embodiments, the second electronic component 1032 may electrically connect to the first electronic component 1031 by a flip-chip technique.

Figure 11:
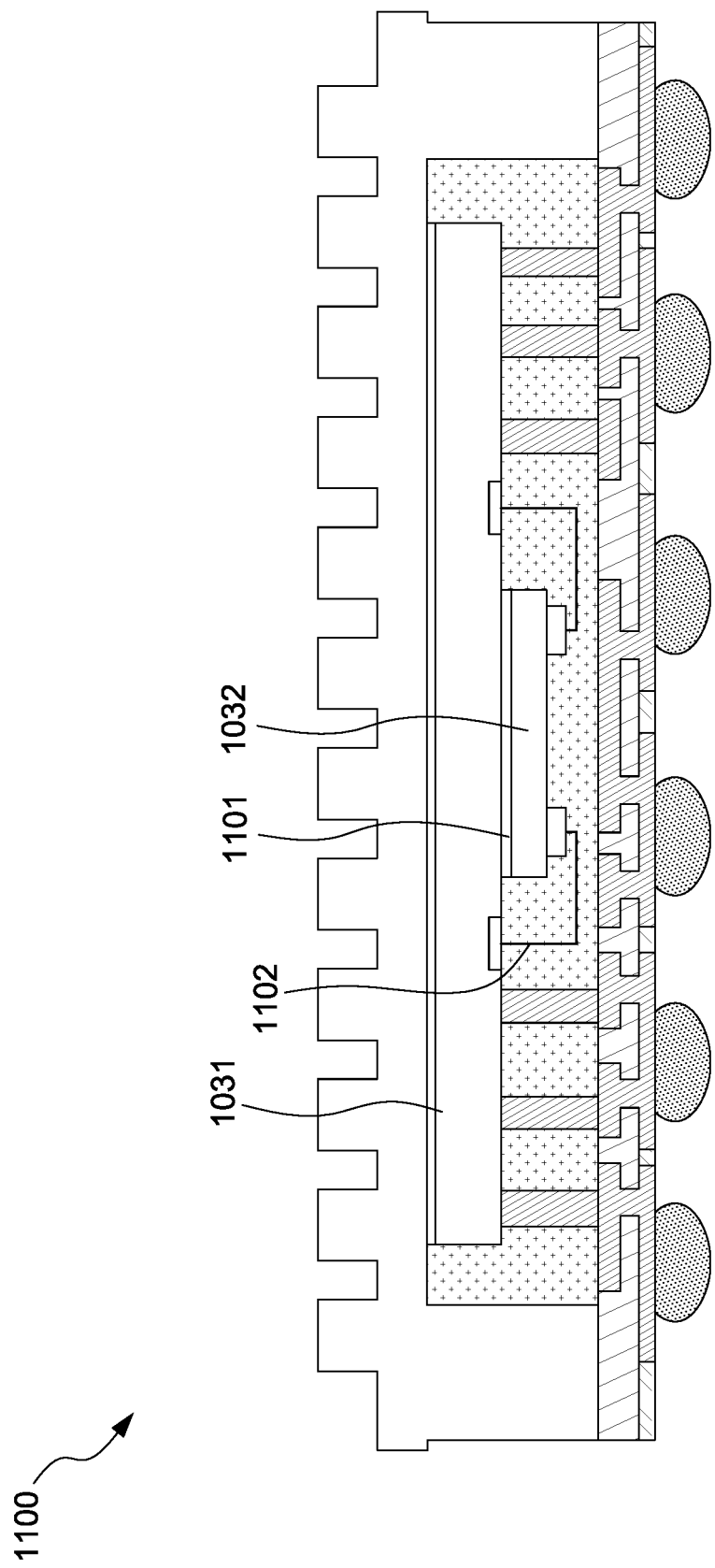
FIG. 11 illustrates a cross-sectional view of an electronic package according to some embodiments of the present disclosure.

FIG. 11 illustrates a cross-sectional view of an electronic package 1100 according to some embodiments of the present disclosure. The electronic package 1100 illustrated in FIG. 11 is similar to that illustrated in FIG. 10 with a difference being that the second electronic component 1032 may be attached to the first electronic component 1031, for example, by a die attach film 1101, the active surface of the second electronic component 1032 faces away from the first electronic component 1031 and the second electronic component 1032 may be electrically connect to the first electronic component 103a by a wire bond 1102.

FIGS. 12A-12F illustrate a method of manufacturing an electronic package such as the electronic package of FIG. 2.

Figure 12A:
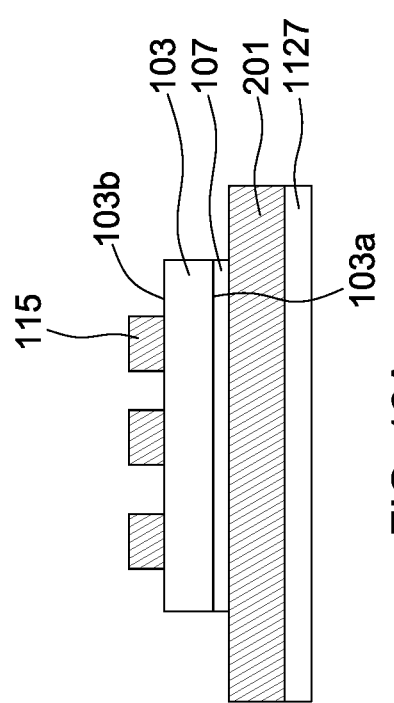
FIG. 12A, FIG. 12B, FIG. 12C, FIG. 12D, FIG. 12E, and FIG. 12F illustrate a method for manufacturing an electronic package according to some embodiments of the present disclosure.

Referring to FIG. 12A, an electronic component 103 is connected to a thermal spreading element 201 by applying a thermal conductive layer 107 between an inactive surface 103a of the electronic component 103 and the thermal spreading element 201. The electronic component 103 may include at least one electrical connector 115 disposed on an active surface 103b of the electronic component 103. The thermal conductive layer 107 may include a thermal conductive adhesive. A carrier 1127 may be provided to support the thermal spreading element 201.

Figure 12B:
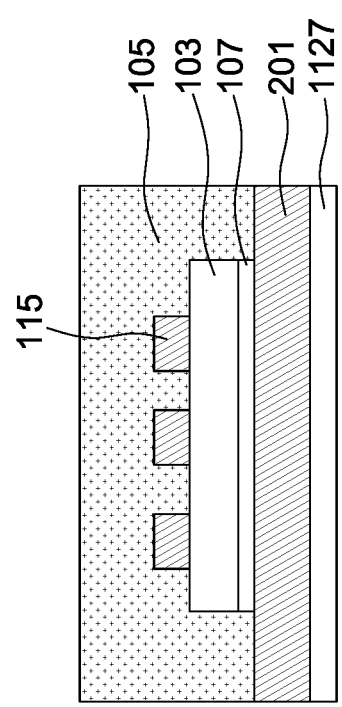

Referring to FIG. 12B, a molding process is performed to encapsulate the electronic component 103, the electrical connector 115, and the thermal conductive layer 107 and form the encapsulant 105 on the thermal spreading element 201.

Figure 12C:
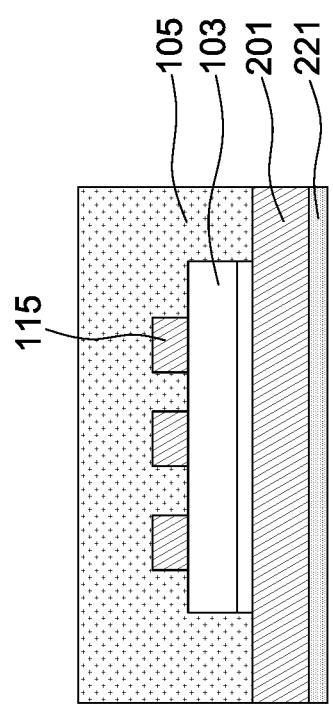

Referring to FIG. 12C, the carrier 1127 is removed from the thermal spreading element 201 and a protection layer 221 is disposed on the thermal spreading element 201. The protection layer may be formed by a printing technique (e.g., a stencil printing technique, a screen printing technique, a spraying technique, a coating technique, an ink jetting technique, a dispensing technique).

Figure 12D:
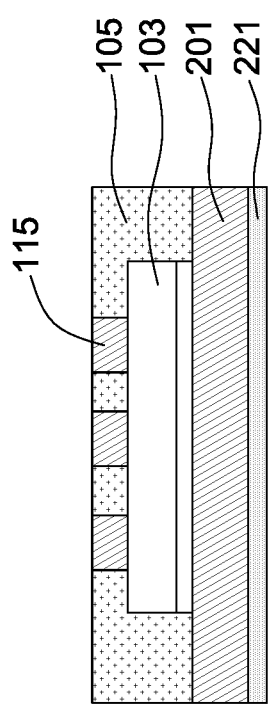

Referring to FIG. 12D, a portion of the encapsulant 105 is removed until the electrical connector 115 is exposed. The portion of the encapsulant 105 may be removed by, for example, a polishing or grinding technique.

Figure 12E:
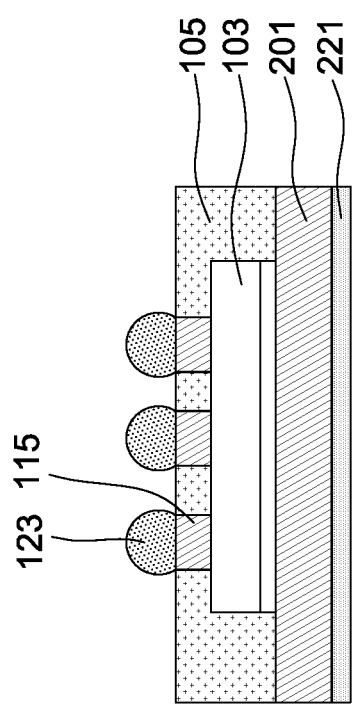

Referring to FIG. 12E, at least one electrical contact 123 (e.g., solder ball) may be disposed on the respective electrical connector 115.

Figure 12F:
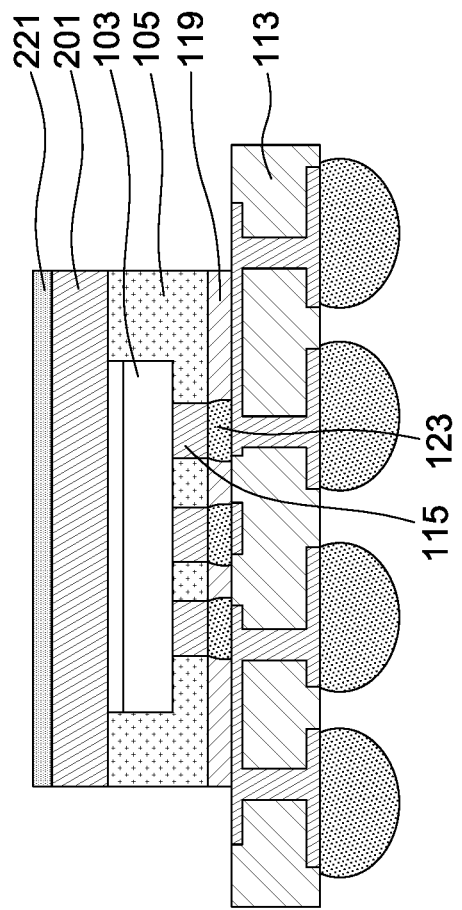

Referring to FIG. 12F, the structure obtained from FIG. 12E may be flip-chipped on and electrically connected to a substrate 113. The dielectric layer 119 is formed on the substrate 113 and surrounds the electrical contact 123. Afterwards, an electronic package (e.g., an electronic package 200 as illustrated in FIG. 2) may be obtained.

In comparison with a method of manufacturing an electronic package where the electronic component 103 is flip-chipped on the substrate 113 first and then molded with a film assisted mold (FAM) technique or in combination with a post-grinding operation to expose the backside (i.e., inactive surface) of the electronic component 103 for connecting to the thermal spreading element 201, the present disclosure may reduce mold flash defects on the backside of the electronic component 103 caused by the FAM, and reduce cracks at the backside of the electronic component 103 caused by the grinding, because the backside of the electronic component 103 is connected to the thermal spreading element 201 first and then the electronic component 103 is molded and ground to expose the electrical connector 115 at the active surface (rather than the backside) of the electronic component 103, and therefore, it is no longer necessary to use the FAM technique or post-grinding operation to expose the backside (i.e., inactive surface) of the electronic component 103 according to the present disclosures.

In some comparative examples, a TIM containing silver and/or indium is dispensed on the backside of the electronic component 103 and the surface of the encapsulant exposing backside of the electronic component 103 and then the thermal spreading element 201 is attached thereto through the TIM. However, it is difficult to ensure that the dispensing of the TIM can achieve a void-free coverage and as discussed above such a TIM has poor adhesion to the material (e.g., silicon), which may cause delamination. In some further comparative examples where a plurality of the electronic components 103 having different height are involved, to avoid the tilt and poor attachment of the thermal spreading element 201 caused by the height deviation of the electronic components 103, a plurality of thermal spreading elements 201 in unit form, rather than a thermal spreading element in strip form, is adopted so that the thermal spreading elements 201 can be attached to a respective one of the electronic components 103. However, such operation results in a low yield (i.e., low UPH). In the present disclosure, since the electronic components 103 are attached to the thermal spreading element 201 first as illustrated in FIG. 12A and the height deviation issue can be overcome by adjusting the dimension of electrical connectors 115 (which will be exposed from the molding material after grinding), it is allowable to use a thermal spreading element in strip form, thereby the UPH can be improved. In addition, in some embodiments according to the present disclosure, a thermal conductive adhesive may be used instead of the TIM containing silver and/or indium, which can further improve the delamination issues.

FIGS. 13A-13F illustrate a method of manufacturing an electronic package such as the electronic package of FIGS. 5(a) and 5(b).

Figure 13A:
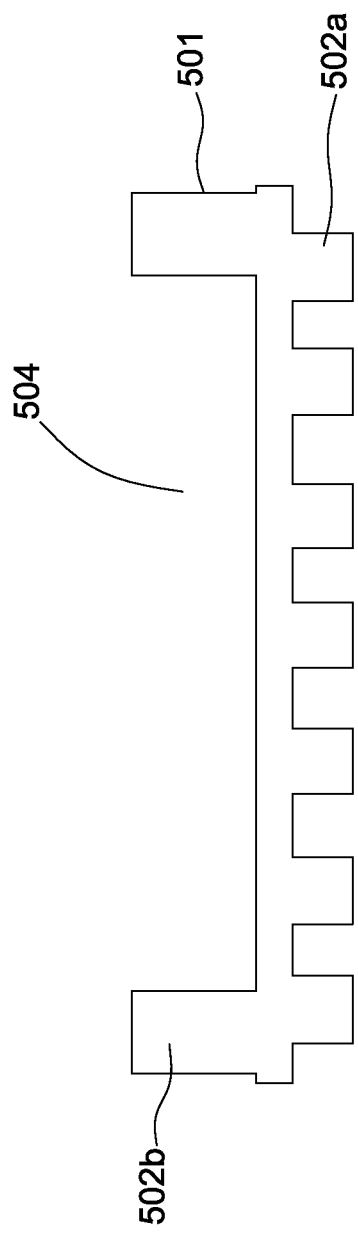
FIG. 13A, FIG. 13B, FIG. 13C, FIG. 13D, FIG. 13E, and FIG. 13F illustrate a method for manufacturing an electronic package according to some embodiments of the present disclosure.

Referring to FIG. 13A, a thermal spreading element 501 is provided. The thermal spreading element 501 may include at least one protrusion portion 502a and at least one second protrusion portion 502b. The thermal spreading element 501 may define a space 504 for accommodating at least one electronic component.

Figure 13B:
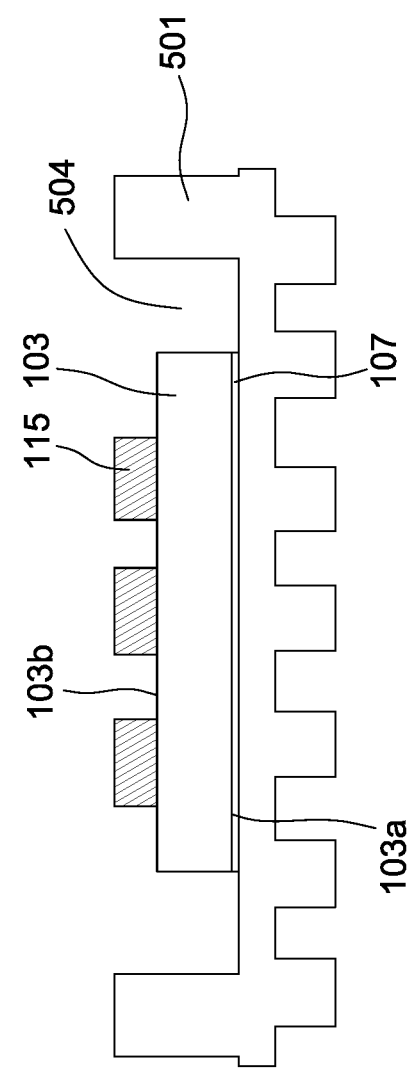

Referring to FIG. 13B, at least one electronic component 103 is disposed in the opening 504 of the thermal spreading element 501. The electronic component 103 may be connected to the thermal spreading element 501 through an inactive surface 103a by a thermal conductive layer 107. The thermal conductive layer 107 may be a thermal conductive adhesive. The electronic component 103 may include at least one electric connector 115 disposed at an active surface 103b.

Figure 13C:
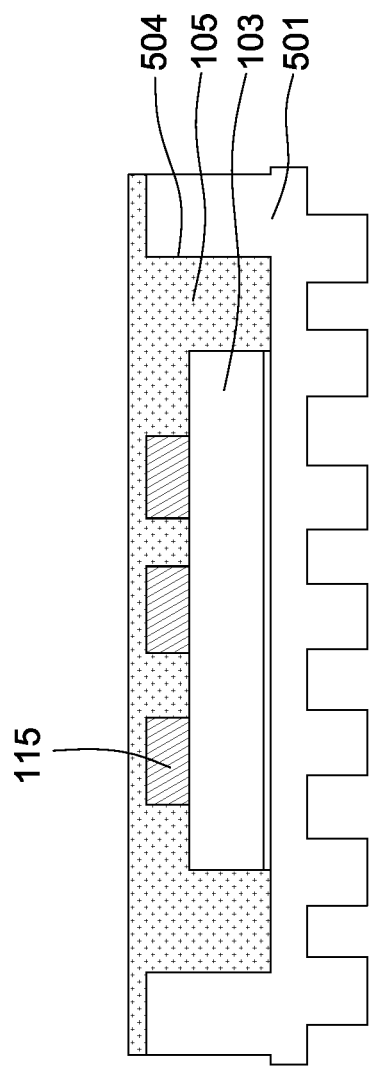

Referring to FIG. 13C, a molding compound is applied to encapsulate the electronic component 103 and the electric connector 115. The molding compound may also cover an outer surface of the second protrusion portion 502b of the thermal spreading element 501. As a result, the encapsulant 105 and the encapsulant 105' (see FIG. 5(a)) are formed. The encapsulant 105 is disposed within the space 504.

Figure 13D:
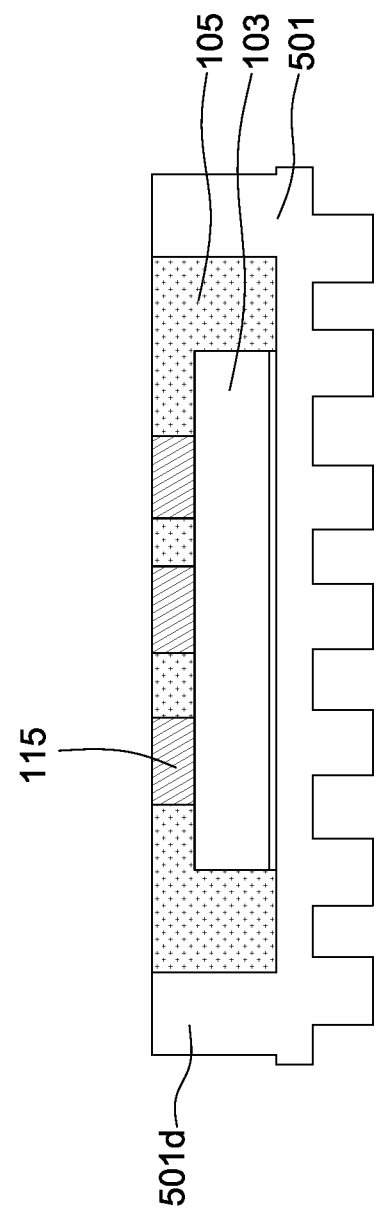

Referring to FIG. 13D, a removal process is performed to remove a portion of the encapsulant 105 and the encapsulant 105' until the electrical connector 115 and a surface of the second protrusion portion of the thermal spreading element 501 are exposed. A surface of the molding compound 105 may be substantially coplanar with the surface 501d of the thermal spreading element 501. The removal process may be carried out by, for example, a polishing or grinding technique.

Figure 13E:
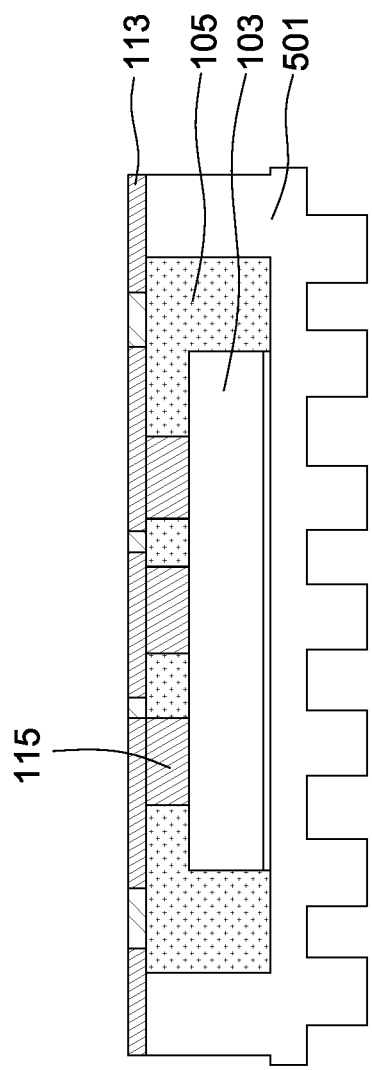

Referring to FIG. 13E, a redistribution layer 113 is disposed on and electrically connected to the exposed electrical connector 115. The redistribution layer 113 may be formed by, for example, a combination of a printing technique, a lithography technique, and an etching technique.

Figure 13F:
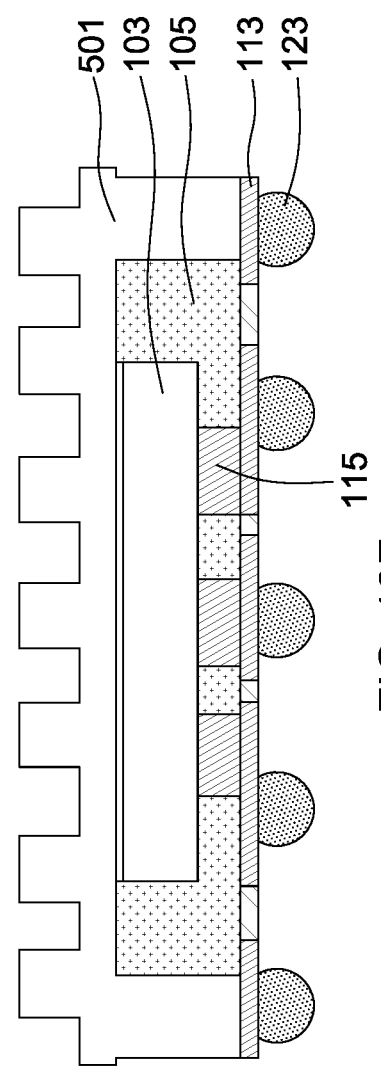

Referring to FIG. 13F, at least one electrical contact 123 is disposed on the distribution layer 113. Afterwards, an electronic package (e.g., an electronic package 500 as is illustrated in of FIGS. 5(a) and 5(b)) may be obtained.

Figure 14C:
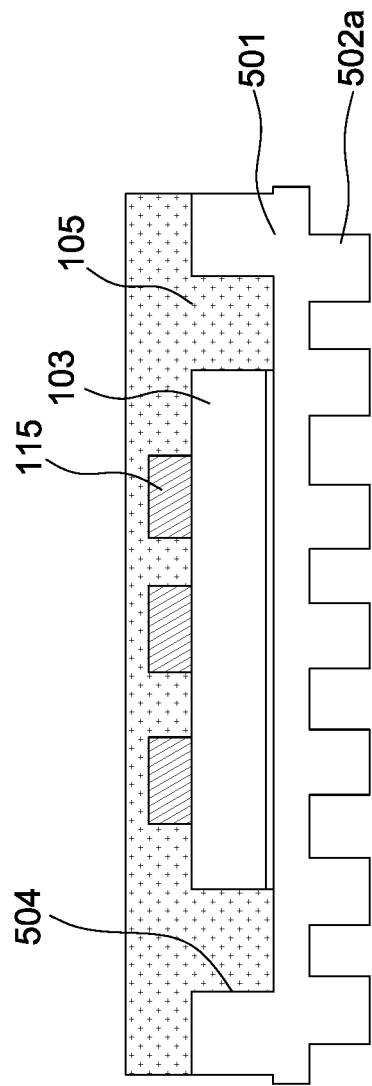

FIGS. 14A-14F illustrate a method of manufacturing an electronic package such as the electronic package of FIGS. 6(a) and 6(b). FIGS. 14A-14C illustrate a method similar to that illustrated in FIGS. 13A-13C, which are not described in detail for brevity.

Figure 14D:
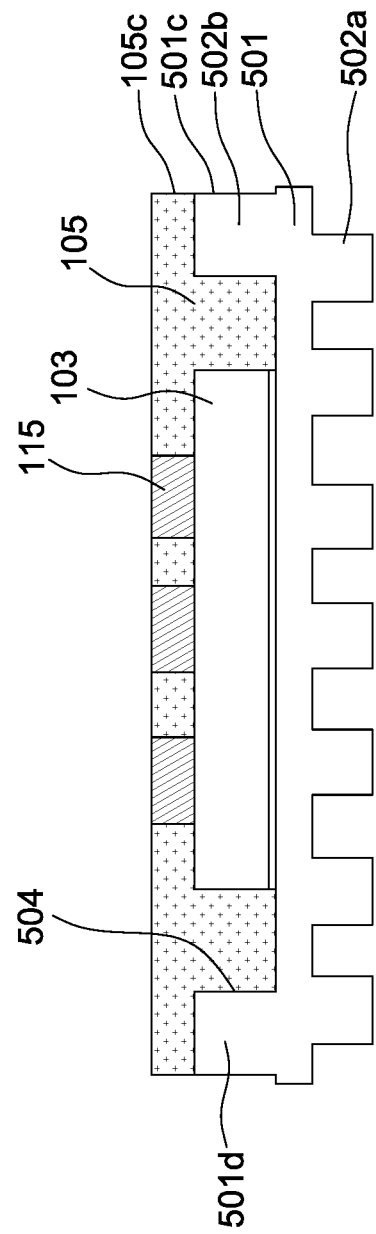

Referring to FIG. 14D, a removal process is performed to remove a portion of the molding compound 105 until the electrical connector 115 is exposed. A portion of the molding compound 105 may remain on a surface 501d of the thermal spreading element 501. A side surface 105c of the portion of the encapsulant 105' may be substantially coplanar with a side surface 501c of the second protrusion portion 502b of the thermal spreading element 501.

Figure 14E:
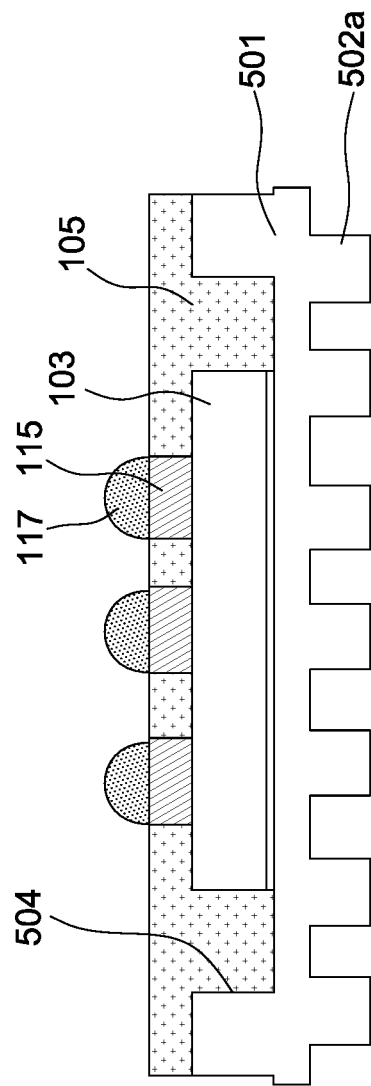

Referring to FIG. 14E, at least one electrical contact 117 may be disposed on the electrical connector 115. The electrical contact 117 may be formed by a soldering material.

Figure 14F:
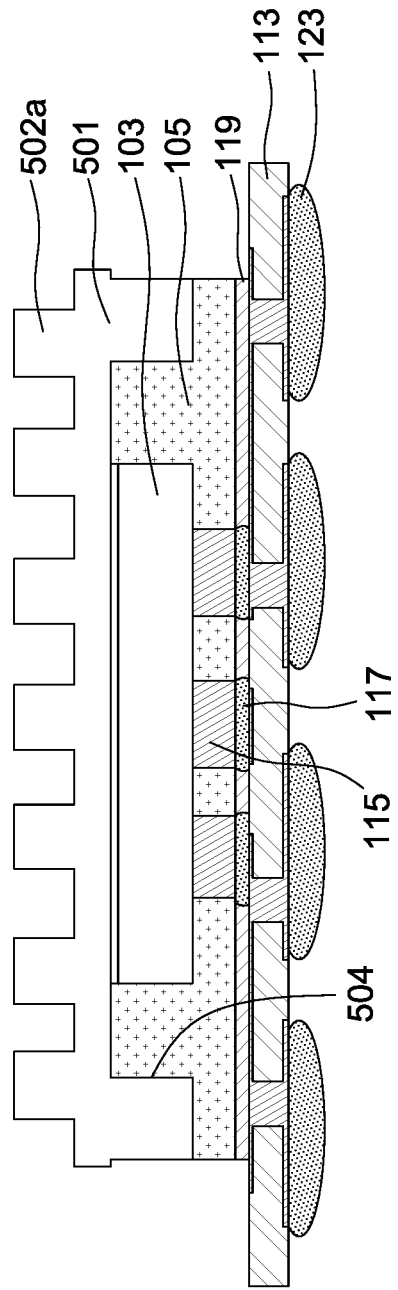

Referring to FIG. 14F, the structure obtained from FIG. 14E may be flip-chipped on and electrically connected to a substrate 113 and the electrical contact 123 is also formed in the substrate. The dielectric layer 119 is formed on the substrate 113 and surrounds the electrical contact 117. Afterwards, an electronic package (e.g., an electronic package 600 as is illustrated in FIGS. 6(a) and 6(b)) may be obtained.

Figure 15A:
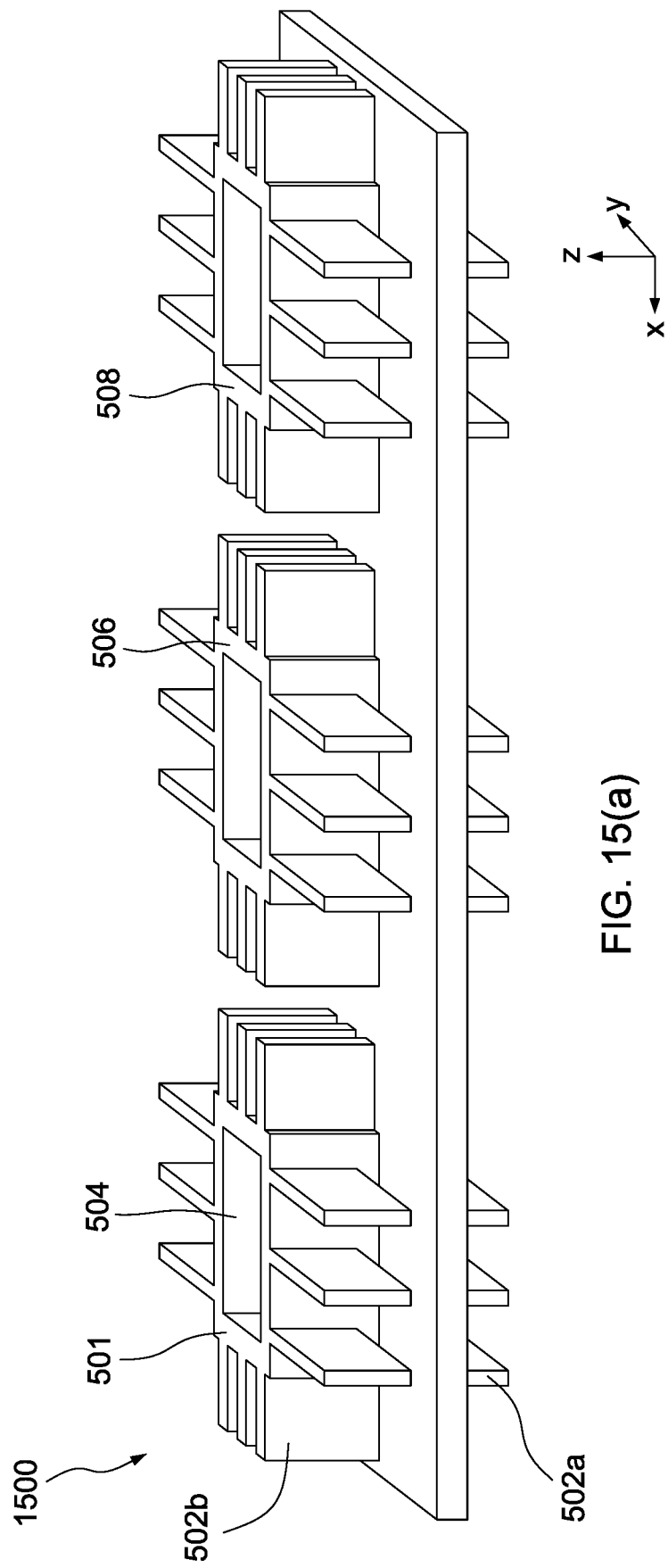
FIG. 15(a) illustrates a three-dimensional view of a thermal spreading element strip according to some embodiments of the present disclosure.
Figure 15B:
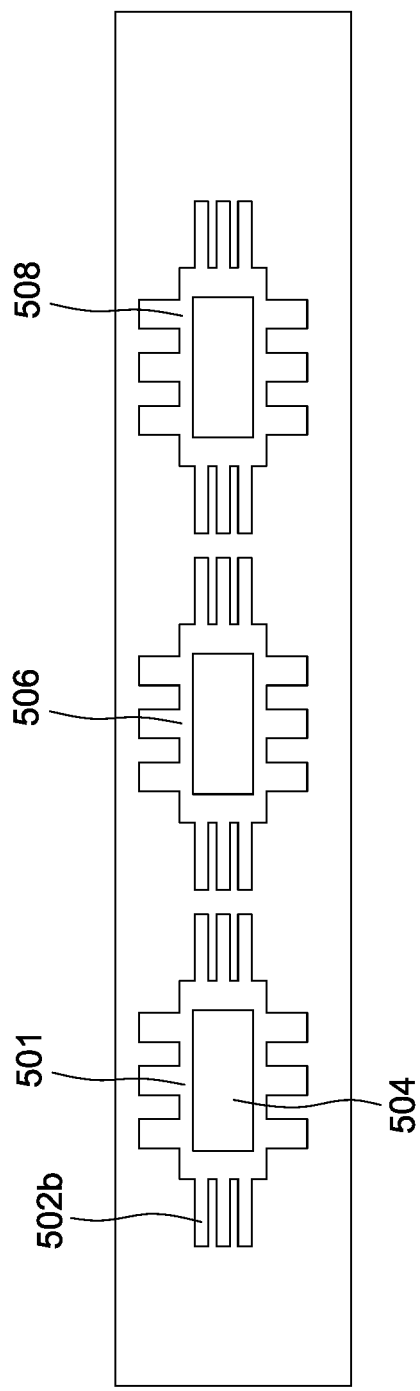
FIG. 15(b) illustrates a top view of the thermal spreading element strip illustrated in FIG. 15(a).
Figure 15C:
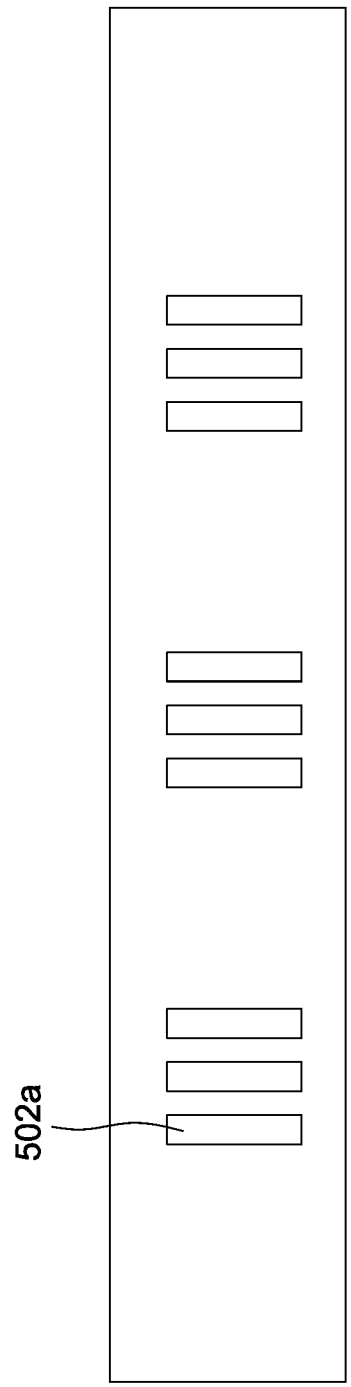
FIG. 15(c) illustrates a bottom view of the thermal spreading element strip illustrated in FIG. 15(a).

FIG. 15(a) illustrates a three-dimensional view of a thermal spreading element strip 1500 according to some embodiments of the present disclosure. FIG. 15(b) illustrates a top view of the thermal spreading element strip 1500 illustrated in FIG. 15(a). FIG. 15(c) illustrates a bottom view of the thermal spreading element strip 1500 illustrated in FIG. 15(a).

The thermal conductive strip 1500 may include a plurality of thermal spreading elements 501, 506, 508. Each of the thermal spreading elements 501, 506, 508 may be applied to the electronic package 500 illustrated in FIGS. 5(a), 5(b) and the electronic package 600 illustrated in FIGS. 6(a) and 6(b). Referring to FIG. 15(a), the thermal spreading element 501 may define a space 504 for accommodating at least one electronic component and the second protrusion portion 502b of the thermal spreading element may be disposed perpendicular to the z-direction.

With the use of the thermal conductive strip 1500, the electronic components can be placed into each space 504 of the thermal spreading elements 501, 506, 508, a molding compound can be applied to cover the electronic components in each space and the second protrusion portion 502b of the thermal spreading elements 501, 506, 508 at the same time, and finally, the electronic packages including the thermal spreading elements 501, 506, 508 respectively can be form by a singulation operation. Thus, the UPH can be improved. In the resulting electronic package, a side surface 105c of the portion of the encapsulant 105' is substantially coplanar with a side surface 501c of the second protrusion portion 502b of the thermal spreading element 501 as described above with respect to FIG. 14D.

Figure 16A:
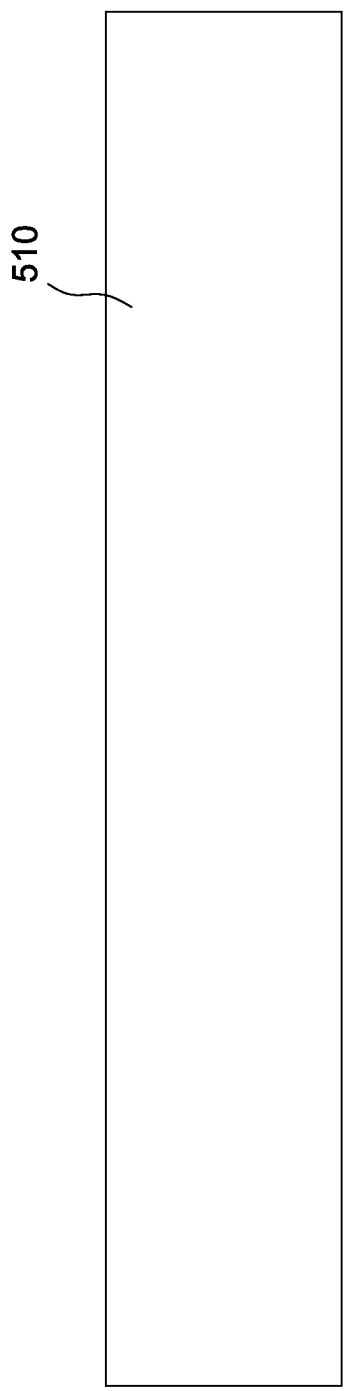
FIG. 16(a) and FIG. 16(b) illustrate a method of manufacturing a thermal spreading element.
Figure 16B:
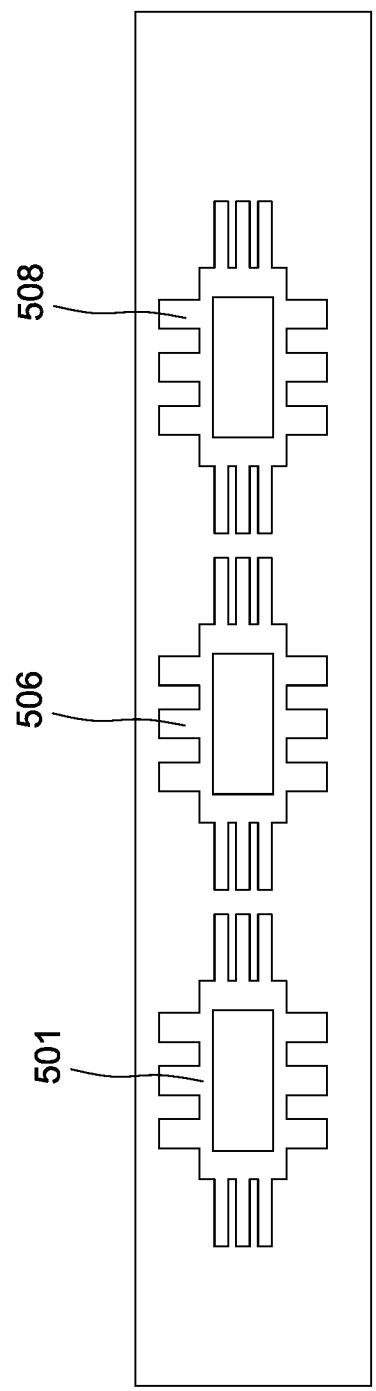

FIGS. 16(a)-16(b) illustrate a method of manufacturing a thermal spreading elements 501, 506 and 508.

Referring to FIG. 16(a), a strip 510 of a thermal conductive plate is provided. The strip 510 of the thermal conductive plate may include metal, for example, copper.

Referring to FIG. 16(b), a plurality of thermal spreading elements 501, 506, 508 may be formed in the strip of the thermal conductive plate by, for example, a combination of a lithography technique and an etching technique, or a metal stamping technique. Afterwards, a singularizing process (e.g., a sawing process) may be performed, and a thermal spreading element (such as the thermal spreading element illustrated in the electronic package of FIGS. 5(a), 5(b), 6(a), and 6(b)) may be obtained.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 µm, no greater than 1 µm, or no greater than 0.5 µm.

As used herein, the singular terms "a," "an," and "the" may include plural referents unless the context clearly dictates otherwise. In the description of some embodiments, a component provided "on or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. An electronic package, comprising:
   an electronic component having a first surface and a second surface opposite to the first surface;
   a thermal spreading element disposed over the electronic component and having a first surface facing the first surface of the electronic component; and
   a first encapsulant covering the electronic component and having a first surface closer to the first surface of the thermal spreading element than the first surface of the electronic component, wherein the second surface of the electronic component is recessed with respect to a bottom surface of the thermal spreading element.

2. The electronic package of claim 1, wherein the first encapsulant further has a second surface opposite to the first surface, the thermal spreading element comprises a base disposed over the electronic component and a sidewall extending from the base toward the second surface of the first encapsulant, the electronic package further comprises a redistribution layer disposed on the second surface of the first encapsulant, and a thickness of the redistribution layer is less than a thickness of the base of the thermal spreading element.

3. The electronic package of claim 1, wherein the thermal spreading element is disposed at five surfaces of the electronic component.

4. The electronic package of claim 3, wherein the thermal spreading element comprises a plurality of protrusions extending outwards from a sidewall of the thermal spreading element and disposed separately on a same side of the electronic component.

5. The electronic package of claim 4, further comprising a second encapsulant disposed between at least two of the protrusions of the thermal spreading element.

6. The electronic package of claim 1, wherein the first encapsulant further has a second surface opposite to the first surface, and the second surface is a ground surface.

7. The electronic package of claim 1, wherein the electronic component comprises a plurality of electrical connectors, and at least one of the electrical connectors directly contacts the first encapsulant.

8. The electronic package of claim 1, further comprising a first electrical connector, a second electrical connector, and a third electrical connector connected to the second surface of the electronic component, wherein the first electrical connector and the second electrical connector are an adjacent pair, the second electrical connector and the third electrical connector are an adjacent pair, and a distance between the first electrical connector and the second electrical connector is different from a distance between the third electrical connector and the second electrical connector.

9. The electronic package of claim 1, further comprising a first electrical connector and a second electrical connector connected to the second surface of the electronic component, wherein a portion of the first encapsulant is between the first electrical connector and the second electrical connector.

10. The electronic package of claim 9, wherein the portion of the first encapsulant directly contacts the second surface of the electronic component.

11. The electronic package of claim 9, wherein the first encapsulant comprises a step structure directly contacting the first electrical connector.

12. The electronic package of claim 9, wherein a height of the portion of the first encapsulant is substantially the same as a height of the first electrical connector.

13. An electronic package, comprising:
    a thermal spreading element;
    a first electronic component attached to the thermal spreading element and including a plurality of first electrical connectors, wherein the first electrical connectors are protruded beyond a bottom surface of the first electronic component;
    an encapsulant encapsulating the first electronic component, wherein a surface of the encapsulant and an end surface of the first electrical connectors are substantially coplanar; and
    a second electronic component encapsulated by the encapsulant and including a plurality of second electrical connectors protruded beyond a bottom surface of the second electronic component,
    wherein a width of the first electrical connectors and a width of the second electrical connectors are different.

14. The electronic package of claim 13, wherein a pitch of the first electrical connectors and a pitch of the second electrical connectors are different.

15. The electronic package of claim 13, wherein a thickness of the first electronic component and a thickness of the second electronic component are different.

16. The electronic package of claim 13, wherein a width of the first electronic component and a width of the second electronic component are different.

17. The electronic package of claim 13, wherein the thermal spreading element comprises a first sidewall adjacent to the first electronic component and a second sidewall adjacent to the second electronic component, the encapsulant comprises a first portion between the first sidewall and the first electronic component and a second portion between the second sidewall and the second electronic component, and a width of the first portion is different from a width of the second portion.

18. The electronic package of claim 13, further comprising an intermediate layer between the thermal spreading element and the first electronic component, wherein a thickness of the intermediate layer is less than a thickness of the first electrical connectors.

\* \* \* \* \*